US012666600B2

(12) United States Patent
Kim et al.

(10) Patent No.: US 12,666,600 B2
(45) Date of Patent: Jun. 23, 2026

(54) SEMICONDUCTOR MEMORY DEVICE HAVING EPITAXIAL LAYER ON THE ACTIVE LAYER

(71) Applicant: Samsung Electronics Co., Ltd., Suwon-si (KR)

(72) Inventors: Beomseo Kim, Suwon-si (KR); Jamin Koo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 395 days.

(21) Appl. No.: 18/210,796

(22) Filed: Jun. 16, 2023

(65) Prior Publication Data

US 2024/0049454 A1     Feb. 8, 2024

(30) Foreign Application Priority Data

Aug. 5, 2022     (KR) ......................... 10-2022-0097677

(51) Int. Cl.
*H10B 12/00*          (2023.01)
(52) U.S. Cl.
CPC ........... *H10B 12/482* (2023.02); *H10B 12/02* (2023.02); *H10B 12/315* (2023.02)
(58) Field of Classification Search
CPC .......................... H10B 12/315; H10B 12/482
See application file for complete search history.

(56) References Cited

U.S. PATENT DOCUMENTS

| | | | |
|---|---|---|---|
| 7,882,344 B2 | 2/2011 | Byun et al. | |
| 8,209,527 B2 | 6/2012 | Im et al. | |
| 8,423,755 B2 | 4/2013 | Byun et al. | |
| 8,841,722 B2 * | 9/2014 | Sammi ................. | H10D 84/038 |
| | | | 257/334 |
| 8,984,237 B2 | 3/2015 | Byun et al. | |
| 9,379,114 B2 | 6/2016 | Jeong et al. | |
| 10,418,366 B2 | 9/2019 | Son et al. | |
| 10,651,176 B2 * | 5/2020 | Chun ................... | H10B 12/482 |
| 11,121,134 B2 | 9/2021 | Lee et al. | |
| 2010/0155799 A1 | 6/2010 | Yokoyama | |
| 2016/0233218 A1 * | 8/2016 | Mikasa ................. | H10D 30/60 |

FOREIGN PATENT DOCUMENTS

| | | |
|---|---|---|
| KR | 1020120003742 A | 1/2012 |
| KR | 101275752 B1 | 6/2013 |
| KR | 1020140083747 A | 7/2014 |
| TW | 201340294 A | 10/2013 |
| TW | 202137497 A | 10/2021 |

OTHER PUBLICATIONS

Office Action dated May 24, 2024 for the corresponding Taiwan Patent Application No. 112124796.

* cited by examiner

*Primary Examiner* — Steven M Page
(74) *Attorney, Agent, or Firm* — Muir Patent Law, PLLC

(57)          ABSTRACT

A semiconductor device includes an active pattern protruding from an upper surface of a substrate in a vertical direction substantially perpendicular to the upper surface of the substrate, an isolation pattern covering a sidewall of the active pattern, an epitaxial layer on the active pattern and including single crystalline silicon doped with impurities, an impurity region in a portion of the active pattern under the epitaxial layer and including impurities, a conductive filling pattern on the epitaxial layer, a spacer structure on a sidewall of the conductive filling pattern, and a bit line structure on the conductive filling pattern.

20 Claims, 33 Drawing Sheets

A          105          A'

D2
⊗ → D1

SEMICONDUCTOR MEMORY DEVICE HAVING EPITAXIAL LAYER ON THE ACTIVE LAYER

CROSS-REFERENCE TO RELATED APPLICATION

This application claims priority under 35 U.S.C. § 119 to Korean Patent Application No. 10-2022-0097677, filed on Aug. 5, 2022, in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a dynamic random access memory (DRAM) device.

DISCUSSION OF RELATED ART

In a method of manufacturing a DRAM device, in order to electrically connect a bit line structure to an active pattern, an opening is formed to expose an upper surface of the active pattern, impurities are doped into an upper portion of the active pattern through the opening, and a conductive pattern is formed in the opening.

However, as the integration degree of the DRAM device increases, an area of the active pattern decreases, and thus a sufficient amount of impurities may not be doped into the upper portion of the active pattern through the opening.

SUMMARY

Example embodiments provide a semiconductor device having improved characteristics.

According to example embodiments of the inventive concepts, there is a semiconductor device. The semiconductor device may include an active pattern protruding from an upper surface of a substrate in a vertical direction substantially perpendicular to the upper surface of the substrate, an isolation pattern covering a sidewall of the active pattern, an epitaxial layer on the active pattern and including single crystalline silicon doped with impurities, an impurity region in a portion of the active pattern under the epitaxial layer and including impurities, a conductive filling pattern on the epitaxial layer, a spacer structure on a sidewall of the conductive filling pattern, and a bit line structure on the conductive filling pattern.

According to example embodiments of the inventive concepts, there is a semiconductor device. The semiconductor device may include an active pattern on a substrate, an epitaxial layer on the active pattern and including single crystalline silicon doped with impurities, an impurity region in a portion of the active pattern under the epitaxial layer and including impurities, and a bit line structure electrically connected to the epitaxial layer. An interface between the impurity region and the epitaxial layer may include chlorine, bromine, or fluorine.

According to example embodiments of the inventive concepts, there is a semiconductor device. The semiconductor device may include an active pattern protruding from an upper surface of a substrate in a vertical direction substantially perpendicular to the upper surface of the substrate, an isolation pattern covering a sidewall of the active pattern, an epitaxial layer on the active pattern and including single crystalline silicon doped with impurities, an impurity region in a portion of the active pattern under the epitaxial layer and including impurities, a conductive filling pattern on the epitaxial layer, a lower spacer structure on a sidewall of the conductive filling pattern, a bit line structure on the conductive filling pattern, a conductive pad structure on each of opposite end portions of the active pattern and overlapping at least a portion of the conductive filling pattern in a horizontal direction substantially parallel to the upper surface of the substrate, a contact plug structure on the conductive pad structure, and a capacitor on the contact plug structure.

In the semiconductor device in accordance with example embodiments, the impurity region may be formed under the central portion of the active pattern contacting the conductive filling pattern electrically connected to the bit line structure to be close to the substrate, and thus the leakage current from the upper portion of the substrate to the lower contact plug electrically connected to the capacitor, that is, a gate induced junction leakage (GIJL) may be reduced or prevented.

Additionally, the epitaxial layer and the impurity region between the bit line structure and the active pattern may include single crystalline silicon doped with impurities, and thus the total contact resistance between the active pattern and the bit line structure may decrease.

DETAILED DESCRIPTION

The above and other aspects and features of a semiconductor device and a method of forming the same in accordance with example embodiments will become readily understood from detail descriptions that follow, with reference to the accompanying drawings. It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process without departing from the teachings of inventive concepts.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1:
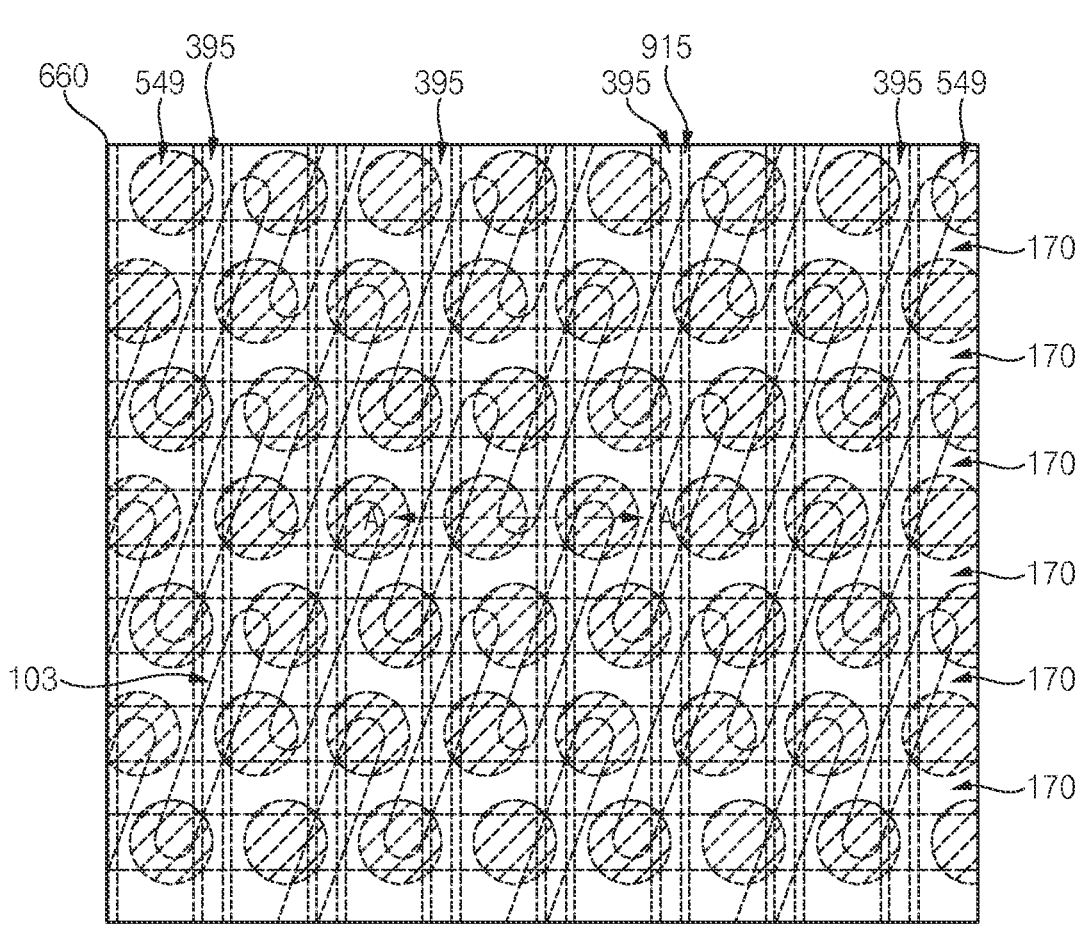
FIG. 1 is a plan view illustrating a semiconductor device in accordance with example embodiments.
Figure 1:
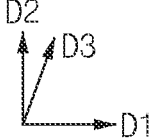
Figure 2:
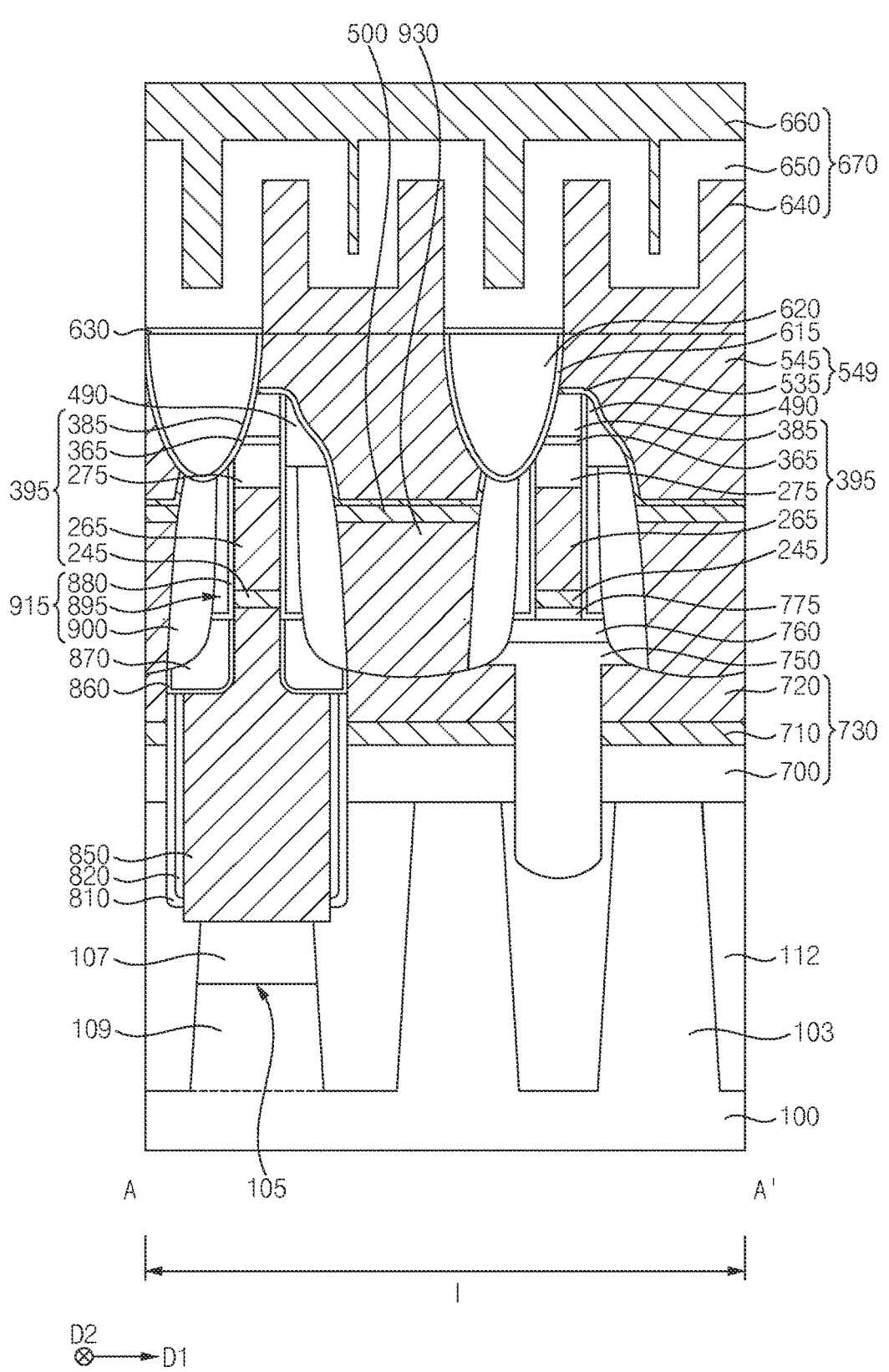
FIG. 2 is a cross-sectional view taken along line A-A' of FIG. 1.

FIG. 1 is a plan view illustrating a semiconductor device in accordance with example embodiments, and FIG. 2 is a cross-sectional view taken along line A-A' of FIG. 1.

Hereinafter, in the specification (and not necessarily in the claims), two directions that are substantially perpendicular to each other among horizontal directions, which are substantially parallel to an upper surface of a substrate, may be referred to as first and second directions D1 and D2, respectively, and a direction having an acute angle with respect to the first and second directions D1 and D2 among the horizontal directions may be referred to as a third direction D3.

Referring to FIGS. 1 and 2, the semiconductor device may include a substrate 100, an active pattern 103, a gate structure 170, an epitaxial layer 107, a filling structure, a bit line structure 395, a contact plug structure, and a capacitor 670.

The semiconductor device may further include an isolation pattern 112, a conductive pad structure 730, first and second insulation pad layers 750 and 760, a third insulation pad 775, an upper spacer structure 915, a third capping pattern 940 (refer to FIG. 17), an insulation pattern structure, a fourth etch stop layer 630, and a fourth upper spacer 490.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

Figure 3:
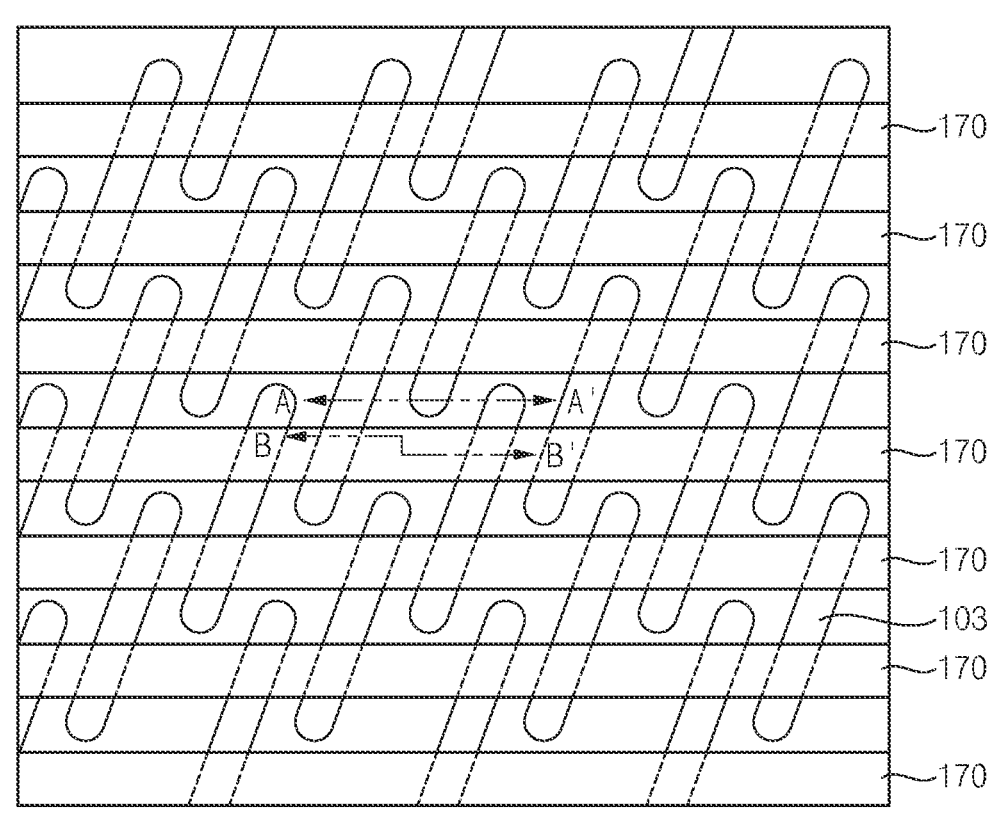
FIGS. 3 to 22 are plan views and cross-sectional views illustrating a method of manufacturing a semiconductor device in accordance with example embodiments.
Figure 3:
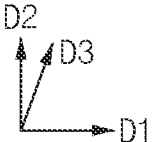

Referring to FIGS. 1 and 2 together with FIG. 3, the active pattern 103 may extend lengthwise in the third direction D3, and a plurality of active patterns 103 may be spaced apart from each other in the first and second directions D1 and D2. A sidewall of the active pattern 103 may be covered by the isolation pattern 112. For example, the isolation pattern 112 may contact sidewalls of the plurality of active patterns 103, and top surfaces of the isolation pattern 112 and the plurality of active patterns 103 may be coplanar with one another. The active patterns 103 may include a material substantially the same as a material of the substrate 100, and the isolation pattern 112 may include an oxide, e.g., silicon oxide.

Figure 4:
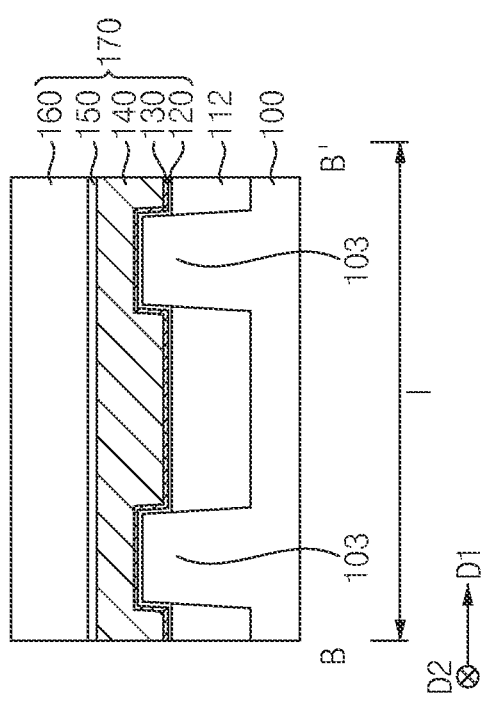
Figure 4:
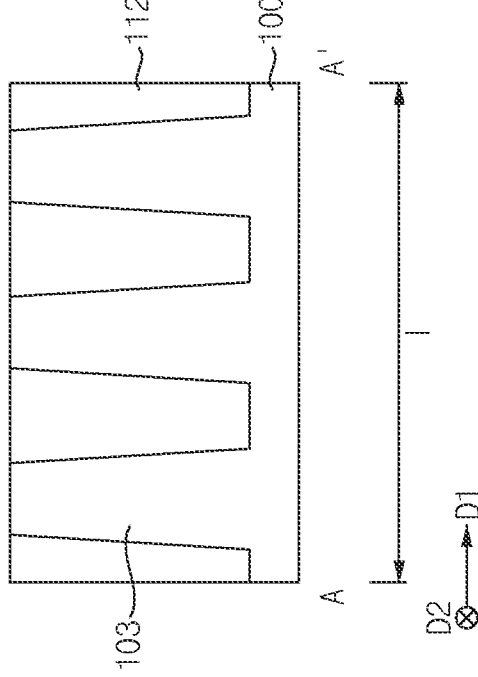

Referring to FIGS. 1 and 2 together with FIG. 4, the gate structure 170 may be formed in a second recess extending in the first direction D1 through upper portions of the active patterns 103 and the isolation pattern 112. The gate structure 170 may include a gate insulation pattern 120 on a bottom and a sidewall of the second recess, a first barrier pattern 130 on a portion of the gate insulation pattern 120 on the bottom and a lower sidewall of the second recess, a first conductive pattern 140 on the first barrier pattern 130 and filling a lower portion of the second recess, a second conductive pattern 150 on upper surfaces of the first barrier pattern 130 and the first conductive pattern 140, and a gate mask 160 on an upper surface of the second conductive pattern 150 and an upper inner sidewall of the gate insulation pattern 120 and filling an upper portion of the second recess. The first barrier pattern 130, the first conductive pattern 140, and the second conductive pattern 150 may collectively form a gate electrode.

The gate insulation pattern 120 may include an oxide, e.g., silicon oxide, the first barrier pattern 130 may include a metal nitride, e.g., titanium nitride, tantalum nitride, etc., the first conductive pattern 140 may include, e.g., a metal, a metal nitride, a metal silicide, etc., the second conductive pattern 150 may include, e.g., doped polysilicon, and the gate mask 160 may include a nitride, e.g., silicon nitride.

In example embodiments, the gate structure 170 may extend lengthwise in the first direction D1, and a plurality of gate structures 170 may be spaced apart from each other in the second direction D2.

Figure 5:
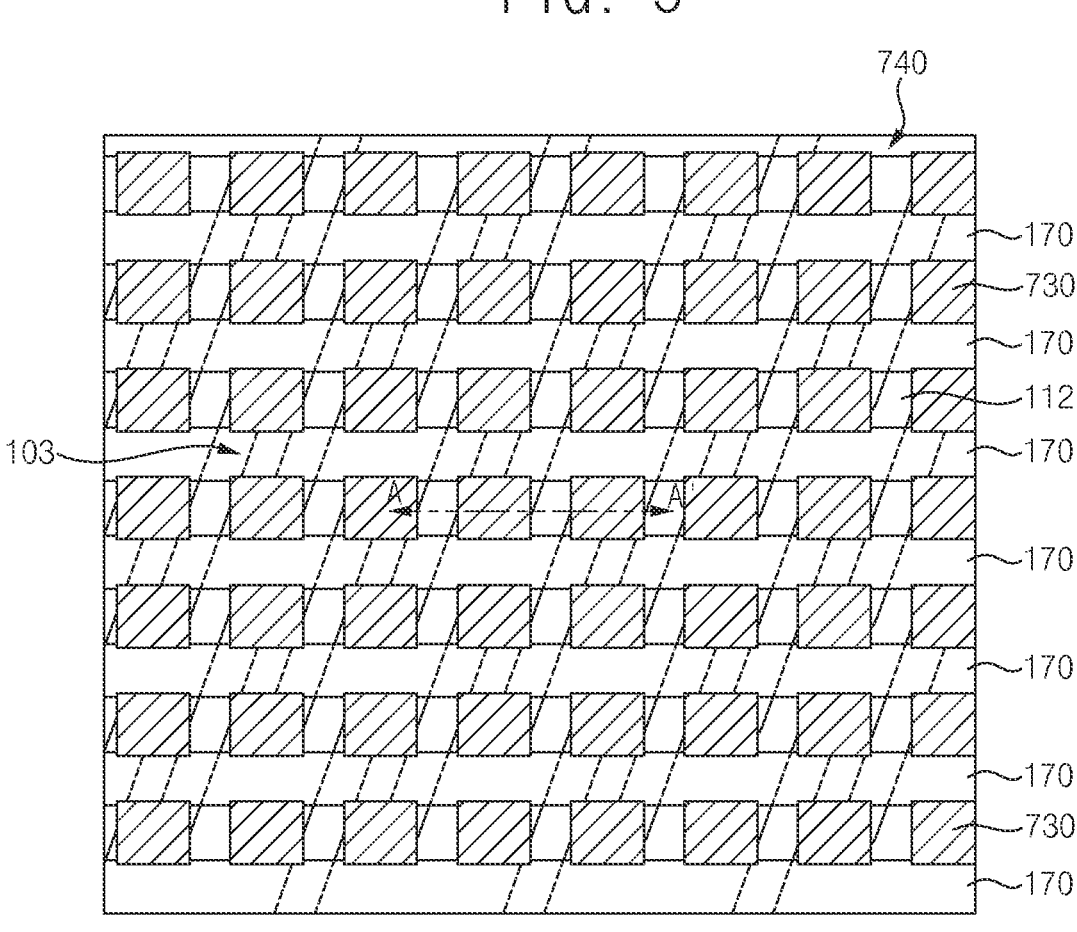
Figure 5:
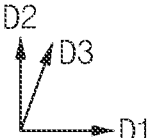
Figure 6:
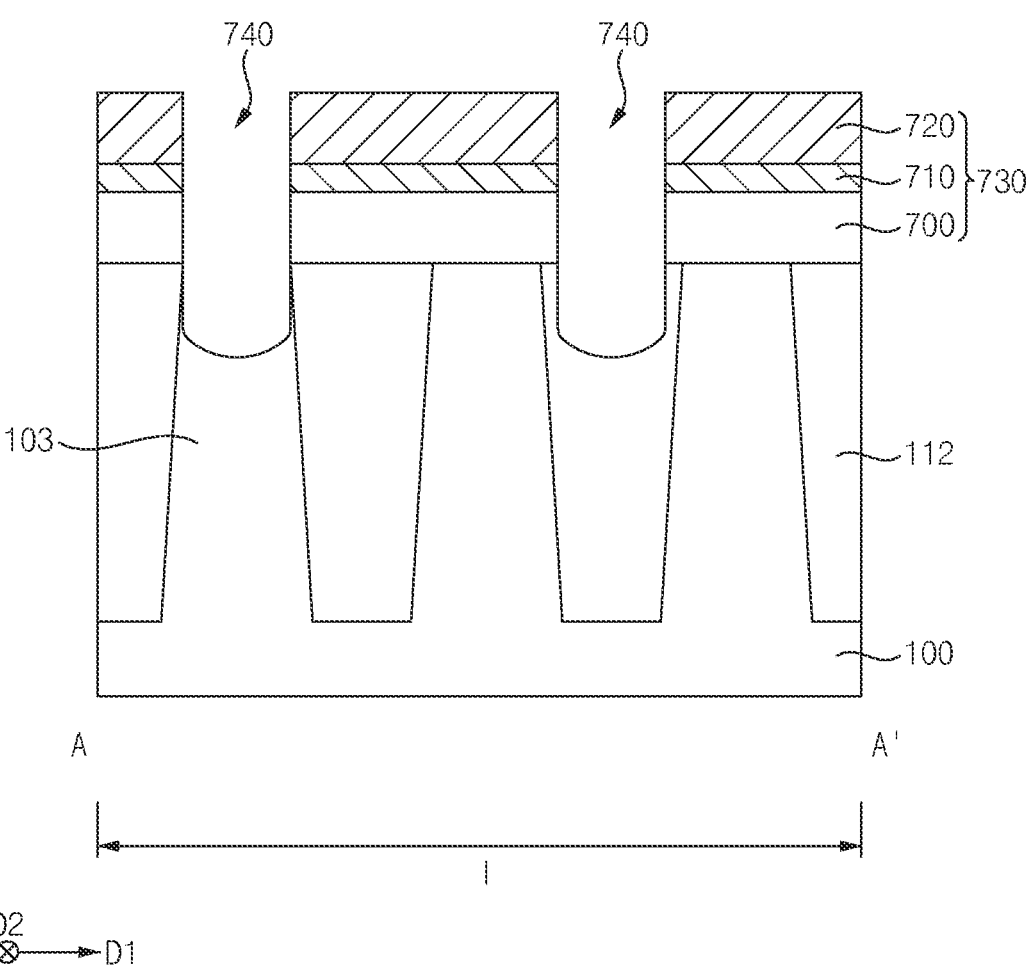

Referring to FIGS. 1 and 2 together with FIGS. 5 and 6, in example embodiments, a plurality of conductive pad structures 730 may be spaced apart from each other in the first and second directions D1 and D2, and may be arranged in a lattice pattern in a plan view.

In example embodiments, each of the conductive pad structures 730 may overlap in a vertical direction substantially perpendicular to the upper surface of the substrate 100 an end portion of a corresponding one of the active patterns 103 extending in the third direction D3 and a portion of the isolation pattern 112 adjacent to the end portion of the active pattern 103 in the first direction D1.

In example embodiments, the conductive pad structures 730 may include first, second, and third conductive pads 700, 710, and 720 sequentially stacked in the vertical direction. In example embodiments, the first conductive pad 700 may include doped polysilicon, the second conductive pad 710 may include a metal silicide, e.g., titanium silicide, cobalt silicide, nickel silicide, etc., a metal nitride, e.g., titanium nitride, tantalum nitride, tungsten nitride, etc., or a metal silicon nitride, e.g., titanium silicon nitride, tantalum silicon nitride, etc., and the third conductive pad 720 may include a metal, e.g., tungsten, ruthenium, etc. Thus, the conductive pad structure 730 may have a multi-layered structure.

Figure 8:
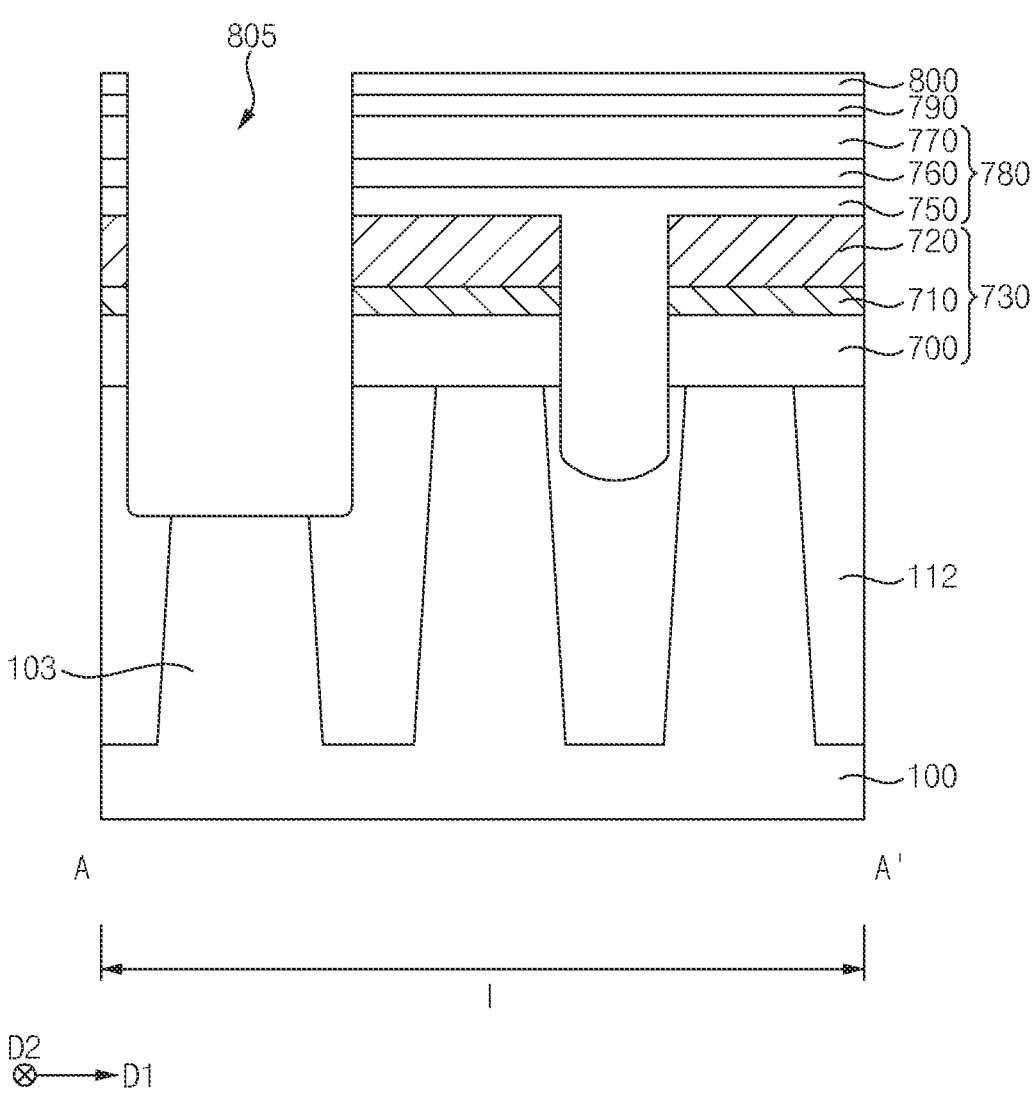

Referring to FIGS. 1 and 2 together with FIGS. 5, 6, and 8, in example embodiments, the first insulation pad layer 750 may be formed in a first opening 740 extending through the conductive pad structure 730 to expose an upper surface of the active pattern 103 or an upper surface of the isolation pattern 112, and the second insulation pad layer 760 and the third insulation pad 775 may be stacked on the first insulation pad layer 750. The first opening 740 may include a first portion extending in the first direction D1 and a second portion extending in the second direction D2, which may be connected with each other. Thus, the first insulation pad layer 750 in the first opening 740 may surround the conductive pad structure 730 arranged in a lattice pattern in a plan view.

In example embodiments, the first insulation pad layer 750 and the third insulation pad 775 may include an insulating nitride, e.g., silicon nitride, and the second insulation pad layer 760 may include a metal oxide, e.g., hafnium oxide, zirconium oxide, etc.

Figure 7:
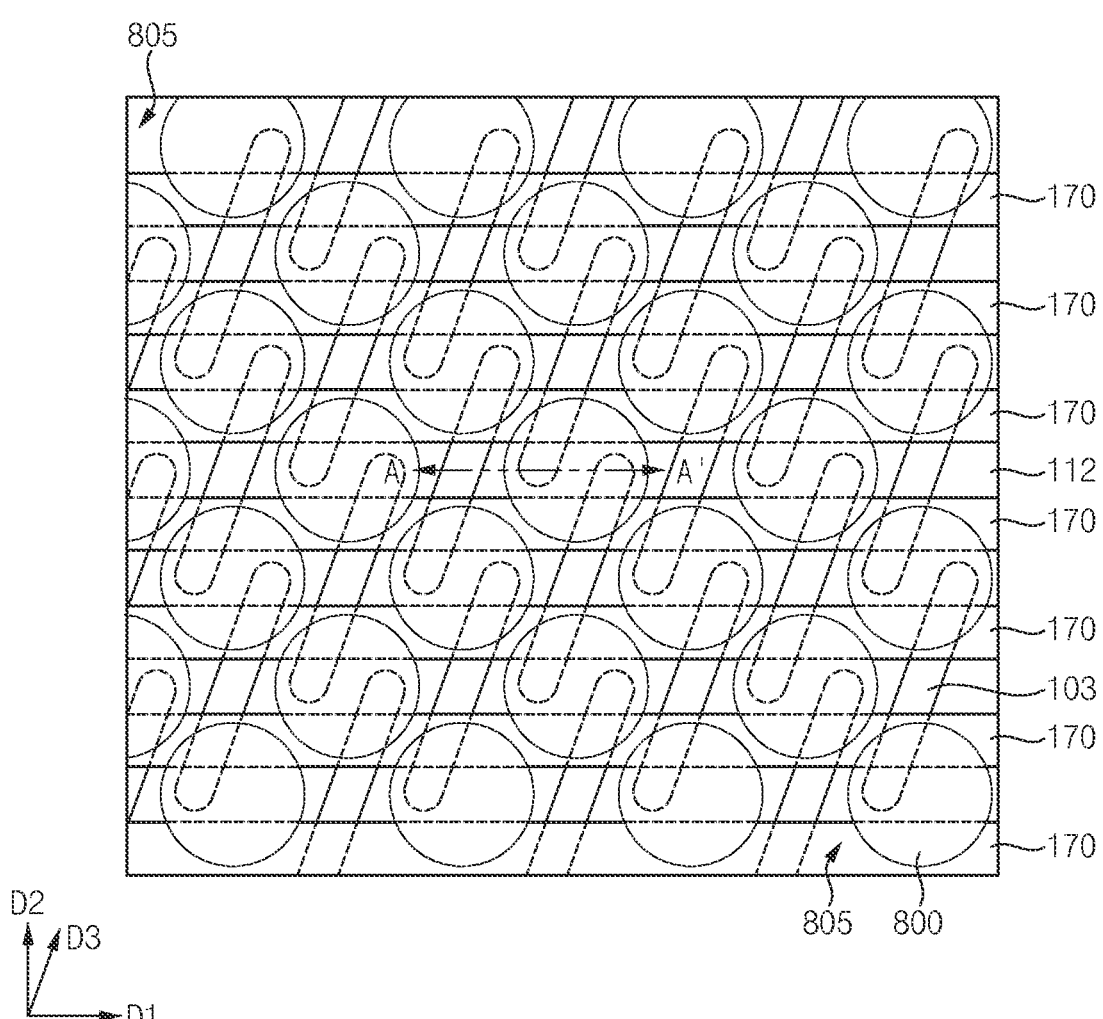

Referring to FIGS. 1 and 2 together with FIGS. 7 and 8, a second opening 805 may be formed through the conductive pad structure 730 to expose upper surfaces of the active pattern 103, the isolation pattern 112 and the gate mask 160 included in the gate structure 170, and an upper surface of a central portion of the active pattern 103 in the third direction D3 may be exposed by the second opening 805.

In an example embodiment, an area of a lower surface of the second opening 805 may be greater than an area of the upper surface of the active pattern 103 exposed by the second opening 805. Thus, the second opening 805 may also expose an upper surface of a portion of the isolation pattern 112 adjacent to the active pattern 103. Additionally, the second opening 805 may extend through an upper portion of the active pattern 103 and an upper portion of the isolation pattern 112 adjacent thereto, and thus a bottom of the second opening 805 may be lower than an upper surface of a portion of the active pattern 103 on which the second opening 805 is not formed, that is, an upper surface of each of opposite end portions in the third direction D3 of the active pattern 103.

Figure 9:
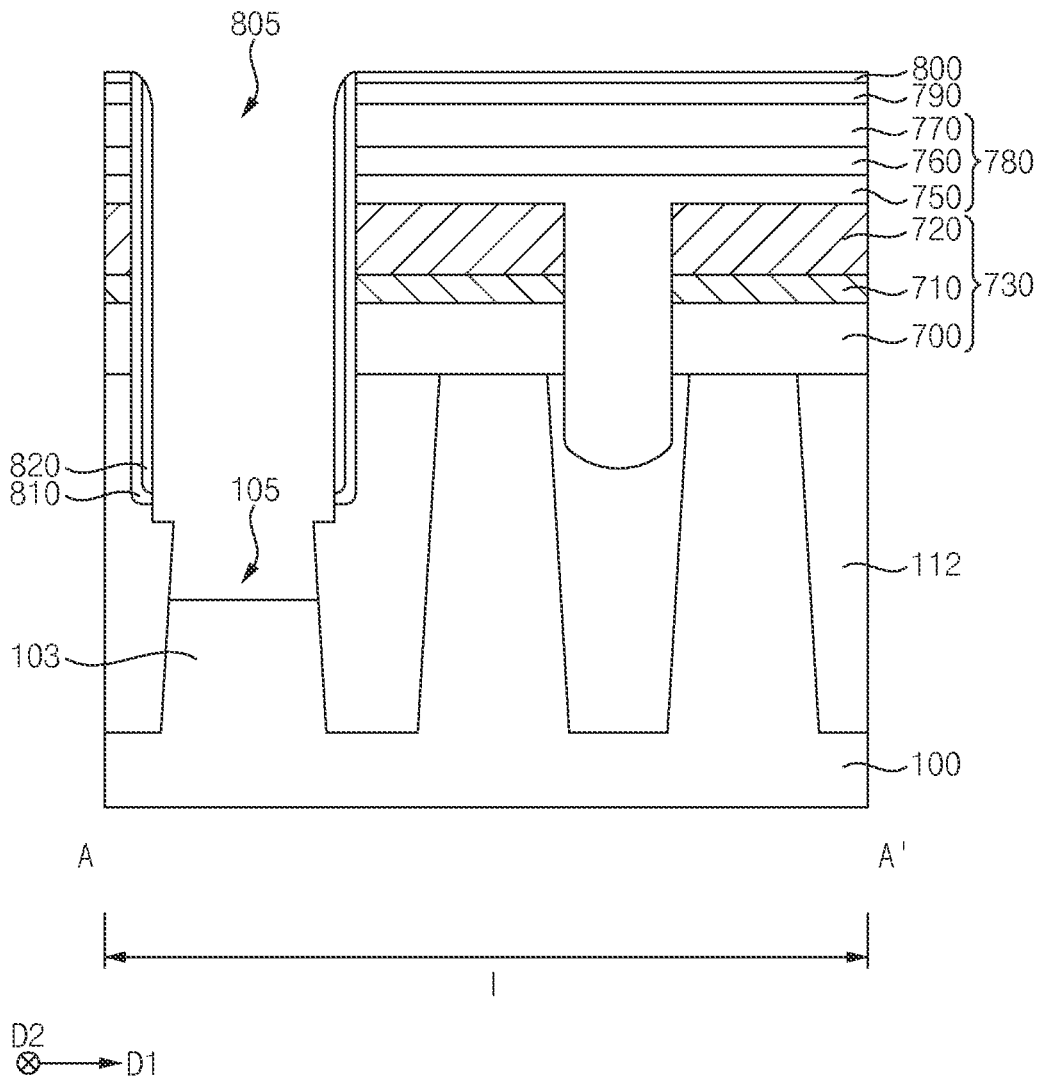
Figure 10:
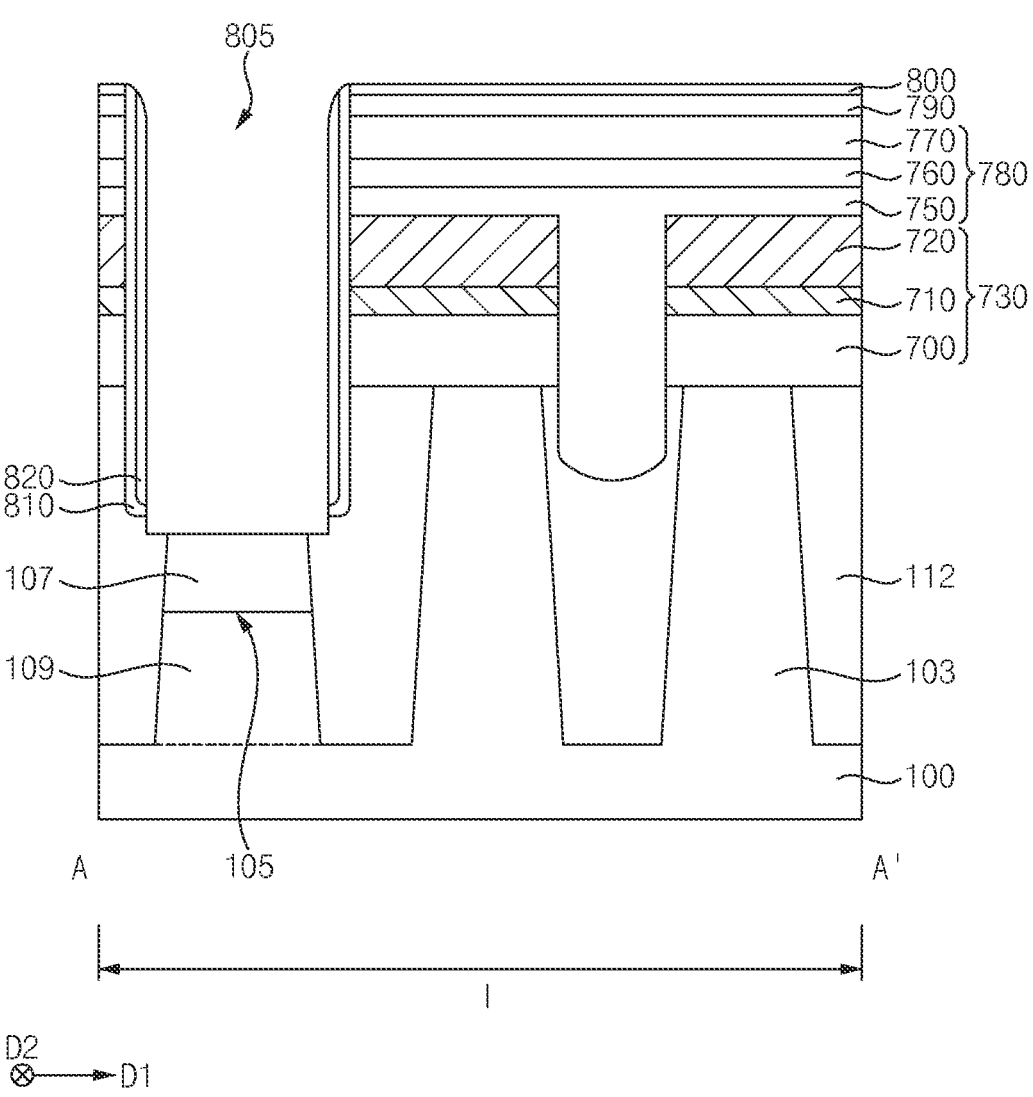

Referring to FIGS. 1 and 2 together with FIGS. 9 and 10, in example embodiments, an upper portion of the active pattern 103 exposed by the second opening 805 may be further removed to form a third recess 105, and the epitaxial layer 107 including crystalline silicon may be doped with n-type impurities, e.g., phosphorus, arsenic, antimony, etc.

In an example embodiment, an upper surface of the epitaxial layer 107 may be substantially coplanar with an upper surface of the third recess 105, that is, the bottom of the second opening 805, and thus may be lower than the upper surface of the portion of the active pattern 103 on which the second opening 805 is not formed, that is, the upper surface of each of opposite end portions in the third direction D3 of the active pattern 103.

In example embodiments, an impurity region 109 including the n-type impurities may be formed in a portion of the active pattern 103 under the third recess 105.

The epitaxial layer 107 may have a crystal plane that is different from that of the impurity region 109 or the active pattern 103, and may include a stacking fault therein.

In example embodiments, an interface between the epitaxial layer 107 and the impurity region 109, or an upper portion of the impurity region 109 adjacent to the interface and/or a lower portion of the epitaxial layer 107 adjacent to the interface may include, e.g. chlorine (Cl), bromine (Br), fluorine (F), etc.

In an example embodiment, a lower surface of the impurity region 109 may be substantially coplanar with a lower surface of the active pattern 103, however, the inventive concept may not be limited thereto.

In example embodiments, the filling structure may include a conductive filling pattern 850, a lower spacer structure, a second capping pattern 860, and an insulating filling pattern 870.

In example embodiments, the conductive filling pattern 850 may include a lower portion having a relatively large width and an upper portion having a relatively small width.

In an example embodiment, the conductive filling pattern 850 may include a metal, e.g., tungsten, titanium, tantalum, etc. Alternatively, the conductive filling pattern 850 may include polysilicon doped with, e.g., n-type impurities.

In example embodiments, at least a portion of the conductive filling pattern 850 may be formed at substantially the same level as the conductive pad structure 730, and thus may overlap the conductive pad structure 730 in the horizontal direction.

The lower spacer structure may cover a sidewall of the conductive filling pattern 850, and may include a second lower spacer 820 and a first lower spacer 810 stacked in the horizontal direction. The second lower spacer 820 may be provided between the first lower spacer 810 and the conductive filling pattern 850. The first lower spacer 810 may include an oxide, e.g., silicon oxide, and the second lower spacer 820 may include, e.g., silicon oxycarbide or silicon nitride.

In an example embodiment, an upper surface of the lower portion of the conductive filling pattern 850 may be substantially coplanar with an uppermost surface of the first and second lower spacers 810 and 820.

The second capping pattern 860 may cover a sidewall of the upper portion of the conductive filling pattern 850 and the upper surface of the lower portion of the conductive filling pattern 850, and the insulating filling pattern 870 may be formed on the second capping pattern 860. The second capping pattern 860 may include an oxide, e.g., silicon oxide or an insulating nitride, e.g., silicon nitride, and the insulating filling pattern 870 may include an insulating nitride, e.g., silicon nitride.

The bit line structure 395 may include an adhesion pattern 245, a third conductive pattern 265, a second mask 275, a third etch stop pattern 365, and a first capping pattern 385 sequentially stacked in the vertical direction on the filling structure. The adhesion pattern 245 and the third conductive pattern 265 may form a conductive structure, and the second mask 275, the third etch stop pattern 365, and the first capping pattern 385 may form an insulation structure. In an example embodiment, the second mask 275, the third etch stop pattern 365, and the first capping pattern 385 sequentially stacked may be merged with each other to form a single insulation structure.

The adhesion pattern 245 may include a metal silicon nitride, e.g., titanium nitride, tantalum nitride, tungsten nitride, etc., the third conductive pattern 265 may include a metal, e.g., tungsten, titanium, tantalum, ruthenium, etc., and each of the second mask 275, the third etch stop pattern 365, and the first capping pattern 385 may include an insulating nitride, e.g., silicon nitride.

In example embodiments, the bit line structure 395 may extend lengthwise in the second direction D2 on the filling structure and the third insulation pad 775, and a plurality of bit line structures 395 may be spaced apart from each other in the first direction D1.

The adhesion pattern 245 may be formed between the third insulation pad 775 including an insulating nitride, e.g., silicon nitride, and the third conductive pattern 265 including a metal, e.g., tungsten, and the third insulation pad 775 and the third conductive pattern 265 may be well attached to each other by the adhesion pattern 245.

The contact plug structure may include a lower contact plug 930, an ohmic contact pattern 500, and an upper contact plug 549 sequentially stacked in the vertical direction on the conductive pad structure 730.

The lower contact plug 930 may contact the third conductive pad 720 so as to be electrically connected to the active pattern 103, particularly, each of end portions in the third direction D3 of the active pattern 103. In example embodiments, referring to FIG. 17, a plurality of lower contact plugs 930 may be spaced apart from each other in the second direction D2 between the bit line structures 395, and the third capping pattern 940 may be formed between neighboring ones of the lower contact plugs 930 in the second direction D2. The third capping pattern 940 may include an insulating nitride, e.g., silicon nitride.

The lower contact plug 930 may include, e.g., doped polysilicon, and the ohmic contact pattern 500 may include, e.g., titanium silicide, cobalt silicide nickel silicide, etc.

In an example embodiment, the upper contact plug 549 may include a second metal pattern 545 and a second barrier pattern 535 covering a lower surface of the second metal pattern 545. In example embodiments, referring to FIG. 1, a plurality of upper contact plugs 549 may be spaced apart from each other in the first and second directions D1 and D2, and may be arranged in a honeycomb pattern or a lattice pattern in a plan view. Each of the upper contact plugs 549 may have a shape of, e.g., a circuit, an ellipse, or a polygon.

The upper spacer structure 915 may include a first upper spacer 880 covering a sidewall of the bit line structure 395 and upper surfaces of portions of the second capping pattern 860 and the insulating filling pattern 870, an air spacer 895 on an outer sidewall of the first upper spacer 880, and a third upper spacer 900 covering an outer sidewall of the second upper spacer 890 and upper surfaces of portions of the second capping pattern 860 and the insulating filling pattern 870.

The first upper spacer 880 may include an insulating nitride, e.g., silicon nitride, the air spacer 895 may include air, and the third upper spacer 900 may include an insulating nitride, e.g., silicon nitride.

The fourth upper spacer 490 may be formed on an outer sidewall of a portion of the first upper spacer 880 on an upper sidewall of the bit line structure 395, and may cover a top end of the air spacer 895 and an upper surface of at least a portion of the third upper spacer 900.

Figure 21:
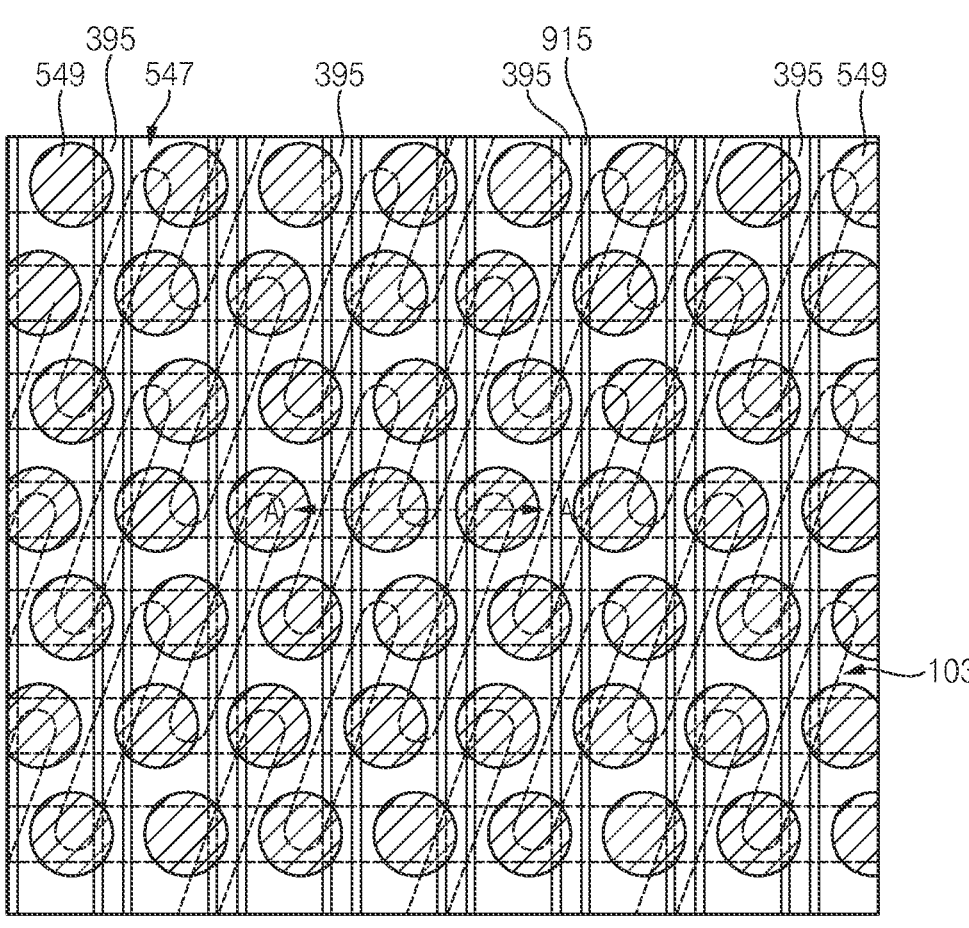
Figure 21:
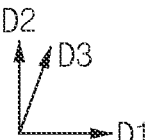
Figure 22:
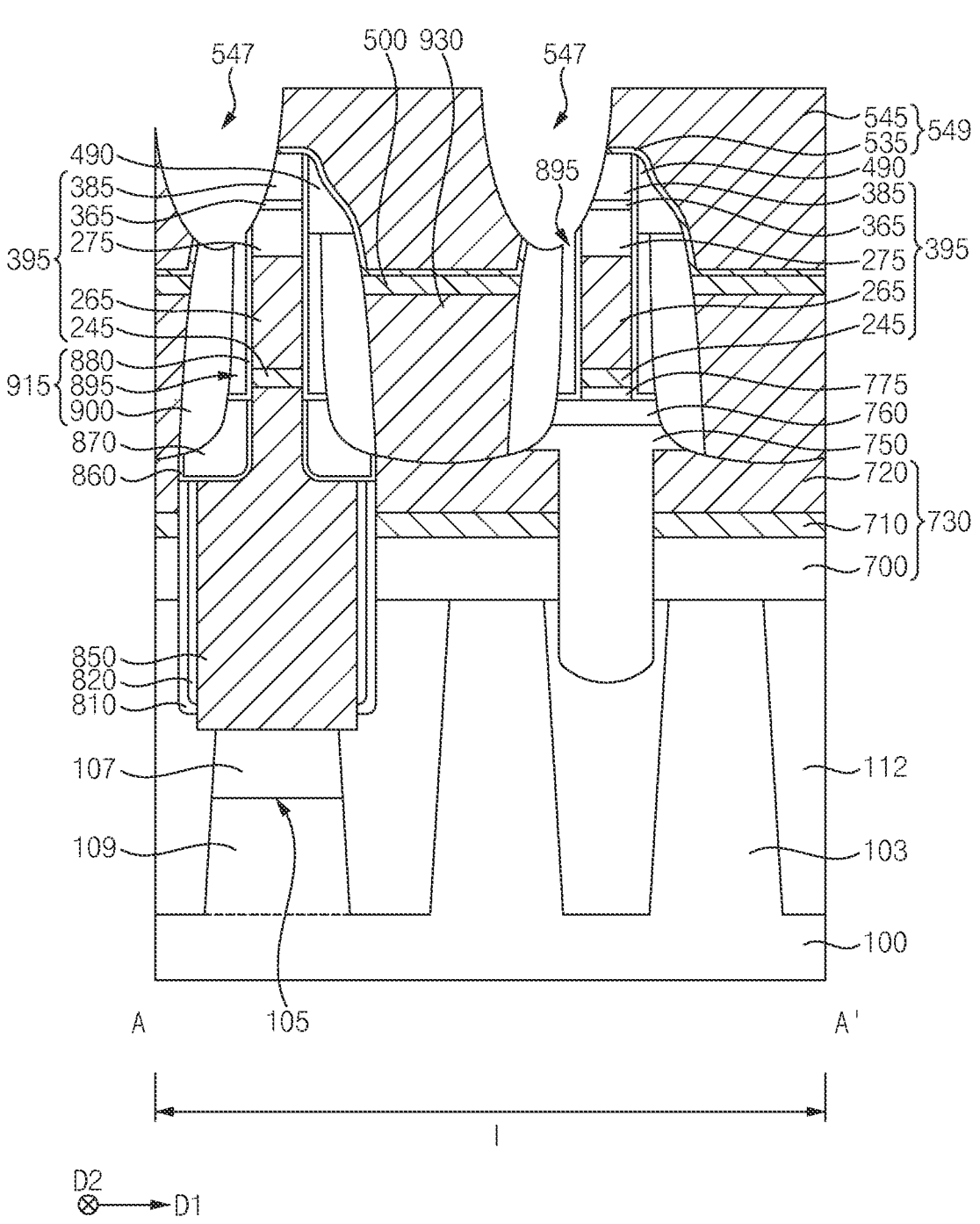

Referring to FIGS. 1 and 2 together with FIGS. 21 and 22, the insulation pattern structure may include a first insulation pattern 615 and a second insulation pattern 620. The first insulation pattern 615 may be formed on an inner wall of a seventh opening 547 extending through the upper contact plug 549 and a portion of the insulation structure included in the bit line structure 395 and surrounding the upper contact plug 549. The second insulation pattern 620 may be formed on the first insulation pattern 615, and may fill a remaining portion of the seventh opening 547. The top end of the air spacer 895 may be closed by the first insulation pattern 615.

The first and second insulation patterns 615 and 620 may include an insulating nitride, e.g., silicon nitride.

The fourth etch stop layer 630 may be formed on the first and second insulation patterns 615 and 620, the upper contact plug 549 and the third capping pattern 940.

The capacitor 670 may be formed on the upper contact plug 549, and may include a lower electrode 640 having a pillar shape or a cylindrical shape, a dielectric layer 650 on a surface of the lower electrode 640, and an upper electrode 660 on the dielectric layer 650.

The lower electrode 640 may include, e.g., a metal, a metal nitride, a metal silicide, doped polysilicon, the dielectric layer 650 may include, e.g., a metal oxide, and the upper electrode 660 may include, e.g., a metal, a metal nitride, a metal silicide, doped silicon-germanium, etc. In an example embodiment, the upper electrode 660 may include a first electrode including a metal or a metal nitride, and a second upper electrode including doped silicon-germanium.

In the semiconductor device, the epitaxial layer 107 may be formed between the conductive filling pattern 850 under the bit line structure 395 and the active pattern 103 on the substrate 100, and the impurity region 109 may be formed in a portion of the active pattern 103 under the epitaxial layer 107. In example embodiments, the epitaxial layer 107 may contact a lower surface of the conductive filling pattern 850.

The epitaxial layer 107 may include single crystalline silicon doped with n-type impurities, and the impurity region 109 may include the n-type impurities diffused from the epitaxial layer 107.

Thus, the impurity region 109 including n-type impurities may be formed under the central portion of the active pattern 103 contacting the conductive filling pattern 850 electrically connected to the bit line structure 395, and may be close to the substrate 100. Thus, charges at an upper portion of the substrate 100 may move to the central portion of the active pattern 103 in which the impurity region 109 is formed, instead of moving to each of end portions in the third direction D3 of the active pattern 103 contacting the conductive pad structure 730 electrically connected to the lower contact plug 930. Accordingly, leakage current from the upper portion of the substrate 100 to the lower contact plug 930, that is, gate induced junction leakage (GIJL), may be reduced or prevented.

Additionally, each of the epitaxial layer 107 and the impurity region 109 may include single crystalline silicon doped with n-type impurities, and thus a total resistance between the active pattern 103 and the bit line structure 395 that may be electrically connected to each other through the epitaxial layer 107 and the impurity region 109 may decrease.

FIGS. 3 to 22 are plan views and cross-sectional views illustrating a method of manufacturing a semiconductor device in accordance with example embodiments. Particularly, FIGS. 3, 5, 7, 17, and 21 are the plan views, FIG. 4 includes cross-sections taken along lines A-A' and B-B' of FIG. 3, and FIGS. 6, 8-16, 18-20, and 22 are cross-sectional views taken along lines A-A' of corresponding plan views, respectively.

Referring to FIGS. 3 and 4, an active pattern 103 may be formed on a substrate 100, and an isolation pattern 112 may be formed to cover a sidewall of the active pattern 103.

The active pattern 103 may be formed by removing an upper portion of the substrate 100 to form a first recess, and a plurality of active patterns 103 each of which may extend lengthwise in the third direction D3 may be formed to be spaced apart from each other in the first and second directions D1 and D2.

The active pattern 103 and the isolation pattern 112 may be partially etched to form a second recess extending lengthwise in the first direction D1.

A gate structure 170 may be formed in the second recess. In example embodiments, the gate structure 170 may extend lengthwise in the first direction D1, and a plurality of gate structures 170 may be formed to be spaced apart from each other in the second direction D2.

Referring to FIGS. 5 and 6, a conductive pad structure 730 may be formed on the active pattern 103 and the isolation pattern 112.

The conductive pad structure 730 may include first, second and third conductive pads 700, 710 and 720 sequentially stacked in the vertical direction.

The conductive pad structure 730 may be patterned by an etching process to form a first opening 740 exposing upper surfaces of the active pattern 103, the isolation pattern 112 and the gate structure 170, and during the etching process, upper portions of the active pattern 103 and the isolation pattern 112 may also be partially removed.

In example embodiments, the first opening 740 may include a first portion extending in the first direction D1 and a second portion extending in the second direction D2 that may be connected with each other. Thus, a plurality of conductive pad structures 730 may be spaced apart from each other to be arranged in a lattice pattern in a plan view.

In example embodiments, the conductive pad structure 730 may overlap in the vertical direction an end portion of the active pattern 103 extending in the third direction D3 and a portion of the isolation pattern 112 adjacent thereto in the first direction D1.

Referring to FIGS. 7 and 8, an insulating pad layer structure 780 may be formed on the conductive pad structure 730 to fill the first opening 740.

In example embodiments, the insulating pad layer structure 780 may include first, second, and third insulation pad layers 750, 760, and 770 sequentially stacked, and the first insulation pad layer 750 may fill the first opening 740.

First and second etch stop layers 790 and 800 may be sequentially formed on the insulating pad layer structure 780. In example embodiments, the first etch stop layer 790 may be formed by a nitridation process on an upper portion of the third insulation pad layer 770 included in the insulating pad layer structure 780 to include, e.g., silicon oxynitride. Additionally, the second etch stop layer 800 may be formed on the first etch stop layer 790 by a deposition process, e.g., a CVD process or an ALD process to include an insulating nitride, e.g., silicon nitride.

A first mask (not shown) may be formed on the second etch stop layer 800, and the first and second etch stop layers 790 and 800, the insulating pad layer structure 780, the conductive pad structure 730, the active pattern 103, the isolation pattern 112, and the gate mask 160 included in the gate structure 170 may be partially etched by an etching process using the first mask as an etching mask to form a second opening 805, and an upper surface of a portion of the active pattern 103 may be exposed by the second opening 805.

In example embodiments, the first mask may have a shape of, e.g., a circle or an ellipse in a plan view, and a plurality of first masks may be spaced apart from each other in the first and second directions D1 and D2. Each of the first masks may overlap in the vertical direction end portions of neighboring ones of the active patterns 103 in the first direction D1 and a portion of the isolation pattern 112 therebetween.

The first mask may be removed.

Referring to FIG. 9, first and second spacer layers may be sequentially formed on a sidewall and a bottom of the second opening 805 and an upper surface of the second etch stop layer 800, and an anisotropic etching process may be performed on the first and second spacer layers.

Thus, a lower spacer structure including first and second lower spacers 810 and 820 may be formed on the sidewall of the second opening 805, and the upper surface of the active pattern 103 and the portion of the isolation pattern 112 adjacent thereto may be exposed again. In example embodiments, the first lower spacer 810 may contact side surfaces of the isolation pattern 112, the conductive pad structure 730, the insulating pad layer structure 780, and the first and second etch stop layers 790 and 800, and the second lower spacer 820 may contact the first lower spacer 810.

During the anisotropic etching process, a portion of the active pattern 103 and a portion of the isolation pattern 112 adjacent thereto may be partially removed, and the second etch stop layer 800 may be partially or entirely removed.

The exposed upper portion of the active pattern 103 may be removed to form a third recess 105.

In an example embodiment, the third recess 105 may be formed by a dry etching process, and the dry etching process may be performed using an etching gas, e.g., chlorine, bromine, fluorine, etc. Thus, chlorine, bromine, fluorine, etc., included in the etching gas may partially remain on the upper surface of the active pattern 103 exposed by the third recess 105.

Alternatively, the third recess 105 may be formed by a wet etching process.

Referring to FIG. 10, a selective epitaxial growth (SEG) process may be performed using the upper surface of the active pattern 103 exposed by the third recess 105, so that an epitaxial layer 107 may be formed to include single crystalline silicon.

In example embodiments, the SEG process the SEG process may be performed using n-type impurity source gas including n-type impurities, e.g., phosphorus, arsenic, antimony, etc., in addition to the silicon source gas, and thus the epitaxial layer 107 may include single crystalline silicon doped with n-type impurities.

In example embodiments, the epitaxial layer 107 may have a crystal plane that is different from a crystal plane of the active pattern 103 under the epitaxial layer 107, and may include stacking fault.

Chlorine, bromine, fluorine, etc., included in the etching process for forming the third recess 105 and remaining on the upper surface of the active pattern 103 may partially remain on a lower surface of the epitaxial layer 107 contacting the upper surface of the active pattern 103.

In example embodiments, during the SEG process for forming the epitaxial layer 107, n-type impurities included in the n-type impurity source gas used in the SEG process may diffuse into the active pattern 103 under the epitaxial layer 107, and thus an impurity region 109 including silicon doped with n-type impurities may be formed under the epitaxial layer 107.

Figure 11:
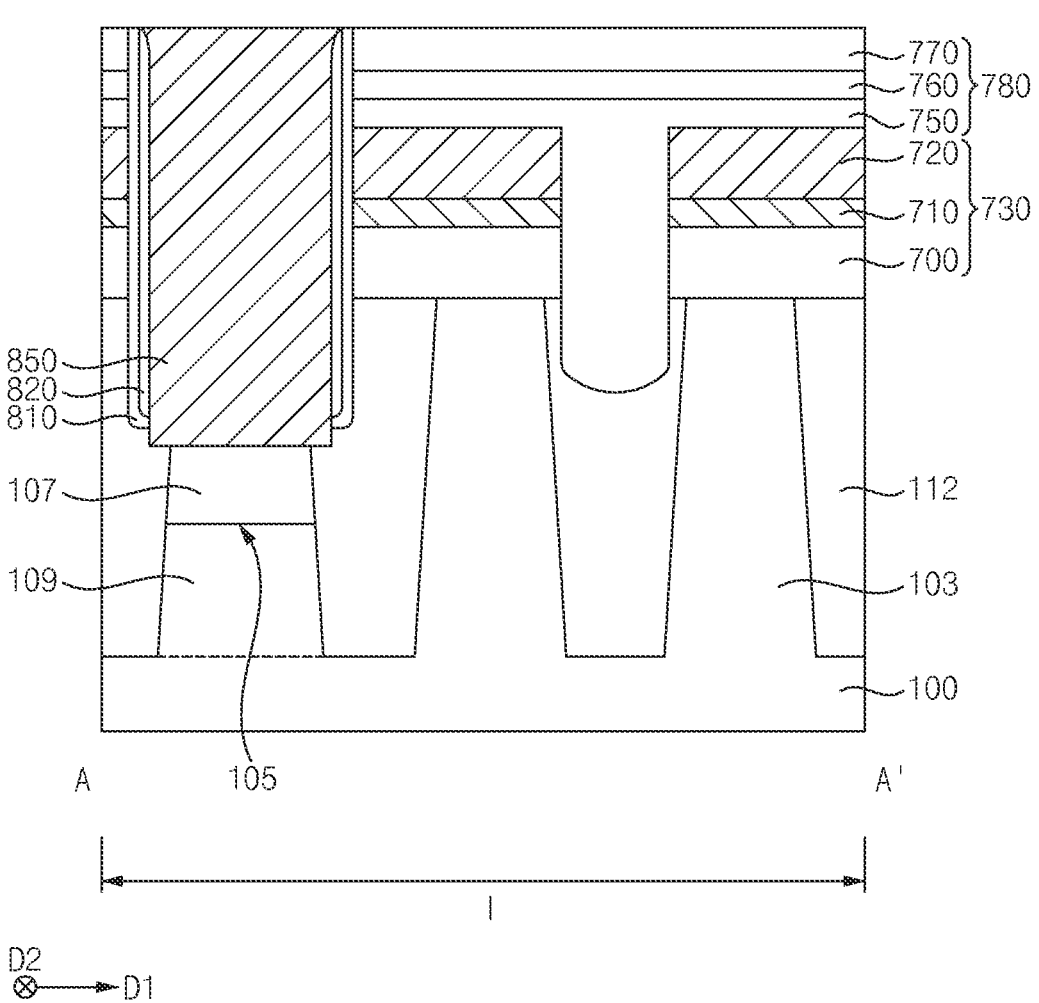

Referring to FIG. 11, a conductive filling pattern 850 may be formed on the epitaxial layer 107 to fill the second openings 805.

The conductive filling pattern 850 may be formed by forming a conductive filling layer on the epitaxial layer 107, the first and second lower spacers 810 and 820, and the first and second etch stop layers 790 and 800 to fill the second openings 805 and performing a planarization process, e.g., a chemical mechanical polishing (CMP) process and/or an etch back process until an upper surface of the insulating pad layer structure 780 is exposed. In example embodiments, the conductive filling pattern 850 may contact the epitaxial layer 107, the isolation pattern 112, and the first and second lower spacers 810 and 820.

During the planarization process, the first and second etch stop layers 790 and 800 may be removed.

Figure 12:
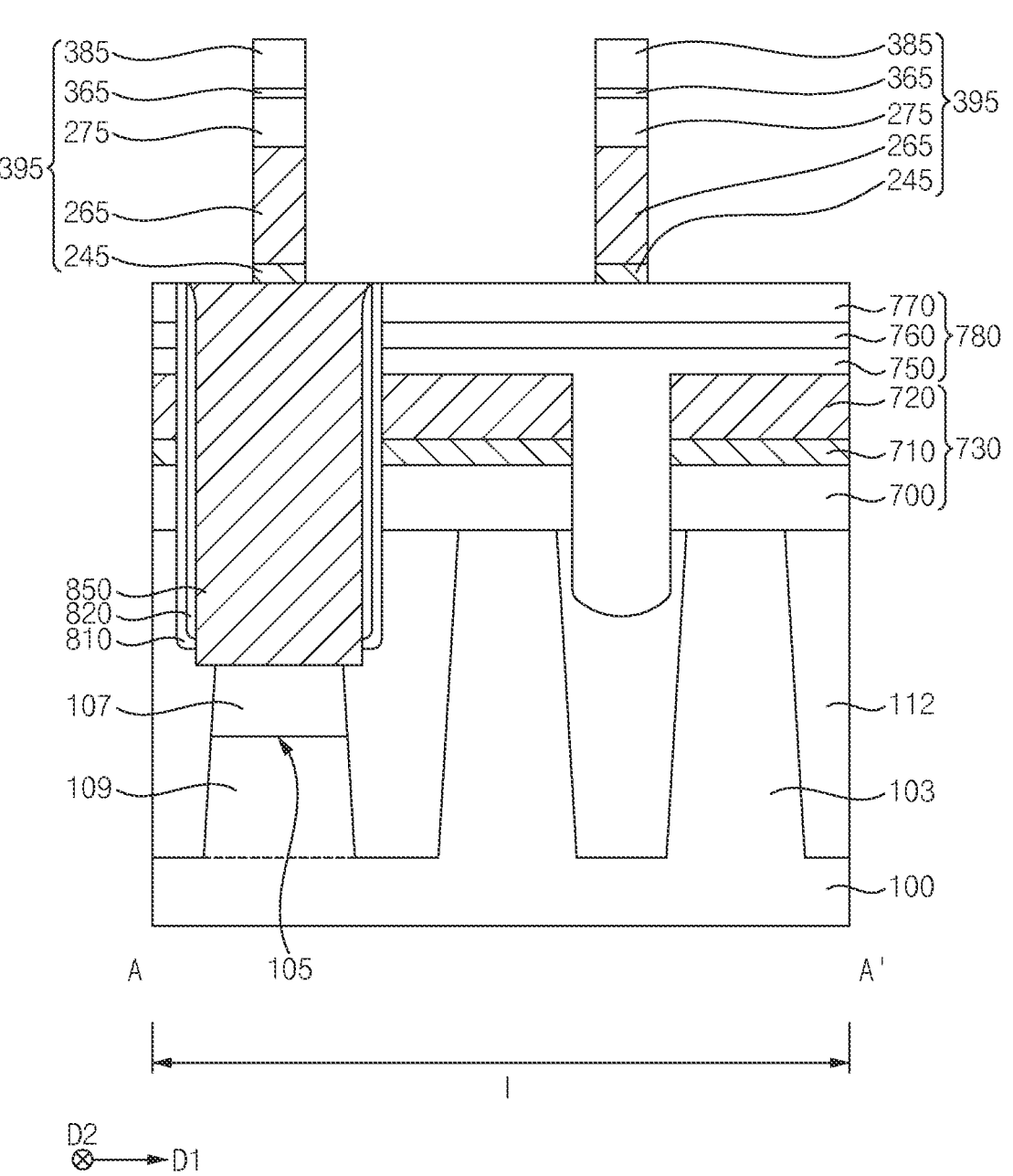

Referring to FIG. 12, an adhesion layer, a third conductive layer, a second mask layer, a third etch stop layer, and a first capping layer may be sequentially formed on the insulating pad layer structure 780, the conductive filling pattern 850 and the lower spacer structure, the first capping layer may be patterned to form a first capping pattern 385, and the third etch stop layer, the second mask layer, the third conductive layer, and the adhesion layer may be sequentially etched using the first capping pattern 385 as an etching mask.

By the etching process, an adhesion pattern 245, a third conductive pattern 265, a second mask 275, a third etch stop pattern 365, and the first capping pattern 385 sequentially stacked may be formed on the conductive filling pattern 850, the insulating pad layer structure 780, and the lower spacer structure. The adhesion pattern 245 may contact upper surfaces of the conductive filling pattern 850 and the third insulation pad layer 770 and a lower surface of the third conductive pattern 265.

The adhesion pattern 245 may be formed between the third insulation pad layer 770 including an insulating nitride, e.g., silicon nitride and the third conductive pattern 265 including a metal, e.g., tungsten, so that the third insulation pad layer 770 and the third conductive pattern 265 may be well attached to each other.

Hereinafter, the adhesion pattern 245, the third conductive pattern 265, the second mask 275, the third etch stop pattern 365, and the first capping pattern 385 sequentially stacked may be collectively referred to as a bit line structure 395. The bit line structure 395 may include a conductive structure having the adhesion pattern 245 and the third conductive pattern 265 and an insulation structure having the second mask 275, the third etch stop pattern 365, and the first capping pattern 385. In an example embodiment, the second mask 275, the third etch stop pattern 365, and the first capping pattern 385 sequentially stacked may be merged with each other to form a single insulation structure.

In example embodiments, the bit line structure 395 may extend lengthwise in the second direction D2 on the substrate 100, and a plurality of bit line structures 395 may be spaced apart from each other in the first direction D1.

Figure 13:
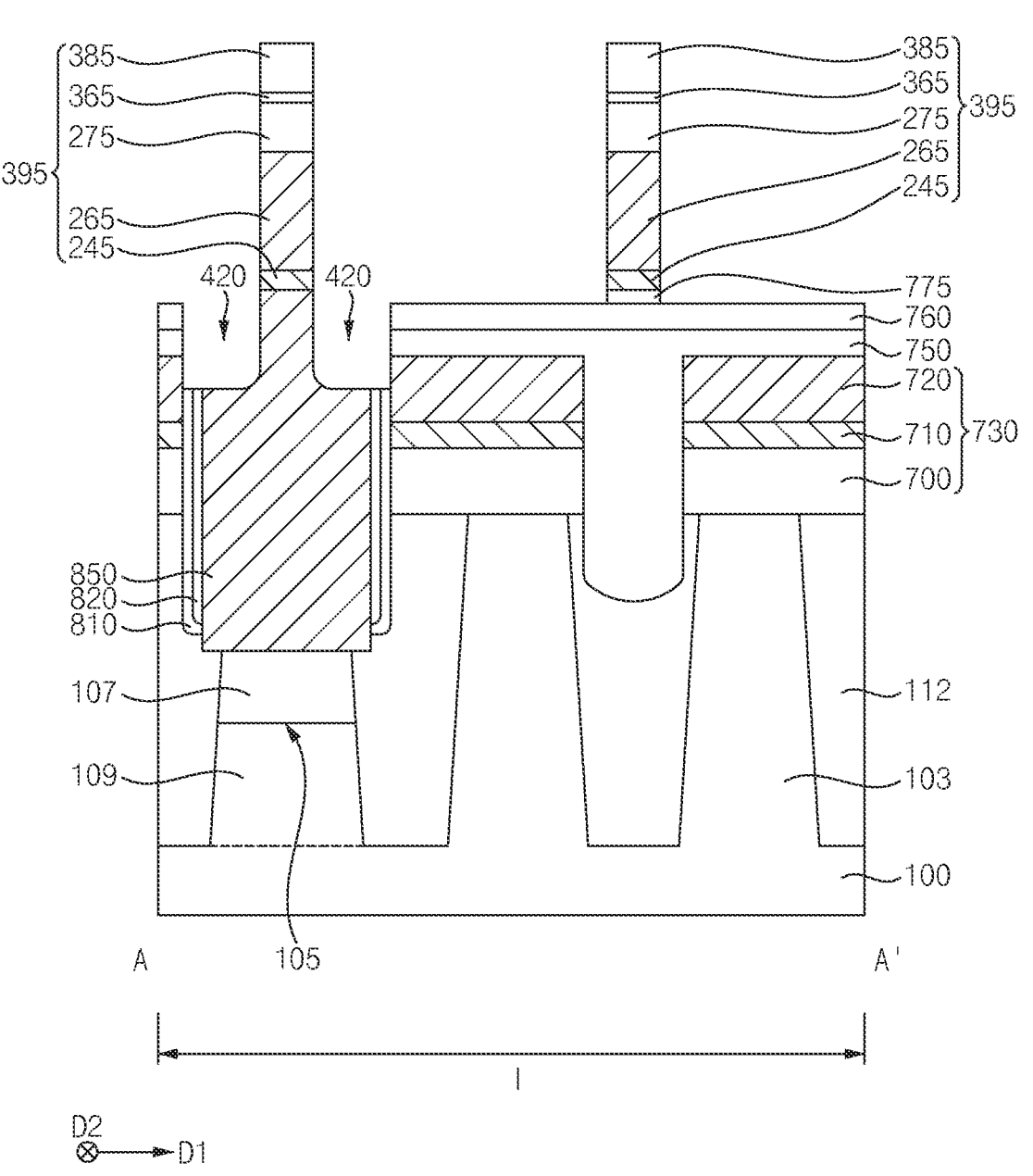

Referring to FIG. 13, upper portions of the conductive filling pattern 850 and the first and second lower spacers 810 and 820 not covered by the bit line structure 395 may be etched by an etching process, so that a fourth recess 420 may be formed.

By the etching process, the conductive filling pattern 850 may have a lower portion having a relatively large width and an upper portion having a relatively small width. In an example embodiment, an upper surface of the lower portion of the conductive filling pattern 850 may be substantially coplanar with uppermost surfaces of the first and second lower spacers 810 and 820. The upper surface of the lower portion of the conductive filling pattern 850 may be at a level lower than an upper surface of the third conductive pad 720.

During the etching process, a portion of the third insulation pad layer 770 not covered by the bit line structure 395 may also be removed, and thus an upper surface of the second insulation pad layer 760 may be exposed. However, a portion of the third insulation pad layer 770 between the second insulation pad layer 760 and the bit line structure 395 may remain as a third insulation pad 775.

Figure 14:
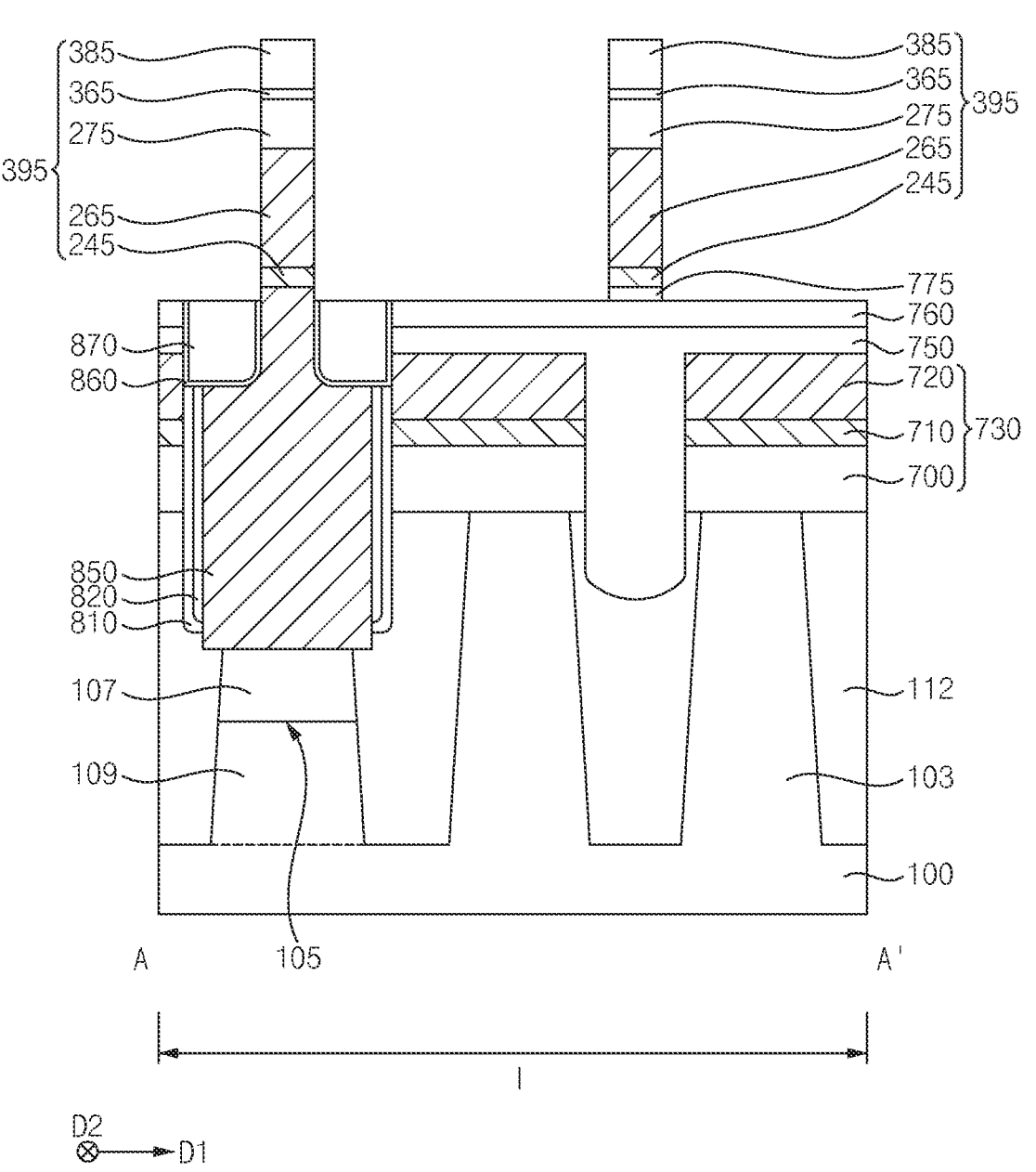

Referring to FIG. 14, a second capping layer may be formed on the bit line structure 395, the conductive filling pattern 850, the lower spacer structure, the first and second insulation pad layers 750 and 760, and the third insulation pad 775 by, e.g., an atomic layer deposition (ALD) process, an insulating filling layer may be formed on the second capping layer to fill the fourth recess 420, and the insulating filling layer may be removed by an etching process until the upper surface of the second insulation pad layer 760 is exposed.

During the etching process, a portion of the second capping layer at an outside of the fourth recess 420 may also be removed, and thus an upper surface and a sidewall of the bit line structure 395, the upper surface of the second insulation pad layer 760, and a sidewall of the third insulation pad 775 may be exposed.

Thus, a second capping pattern 860 may remain on an inner wall of the fourth recess 420, and an insulating filling pattern 870 may be formed on the second capping pattern 860. The lower spacer structure, the conductive and insulating filling patterns 850 and 870, and the second capping pattern 860 in the second openings 805 may collectively form a filling structure.

Figure 15:
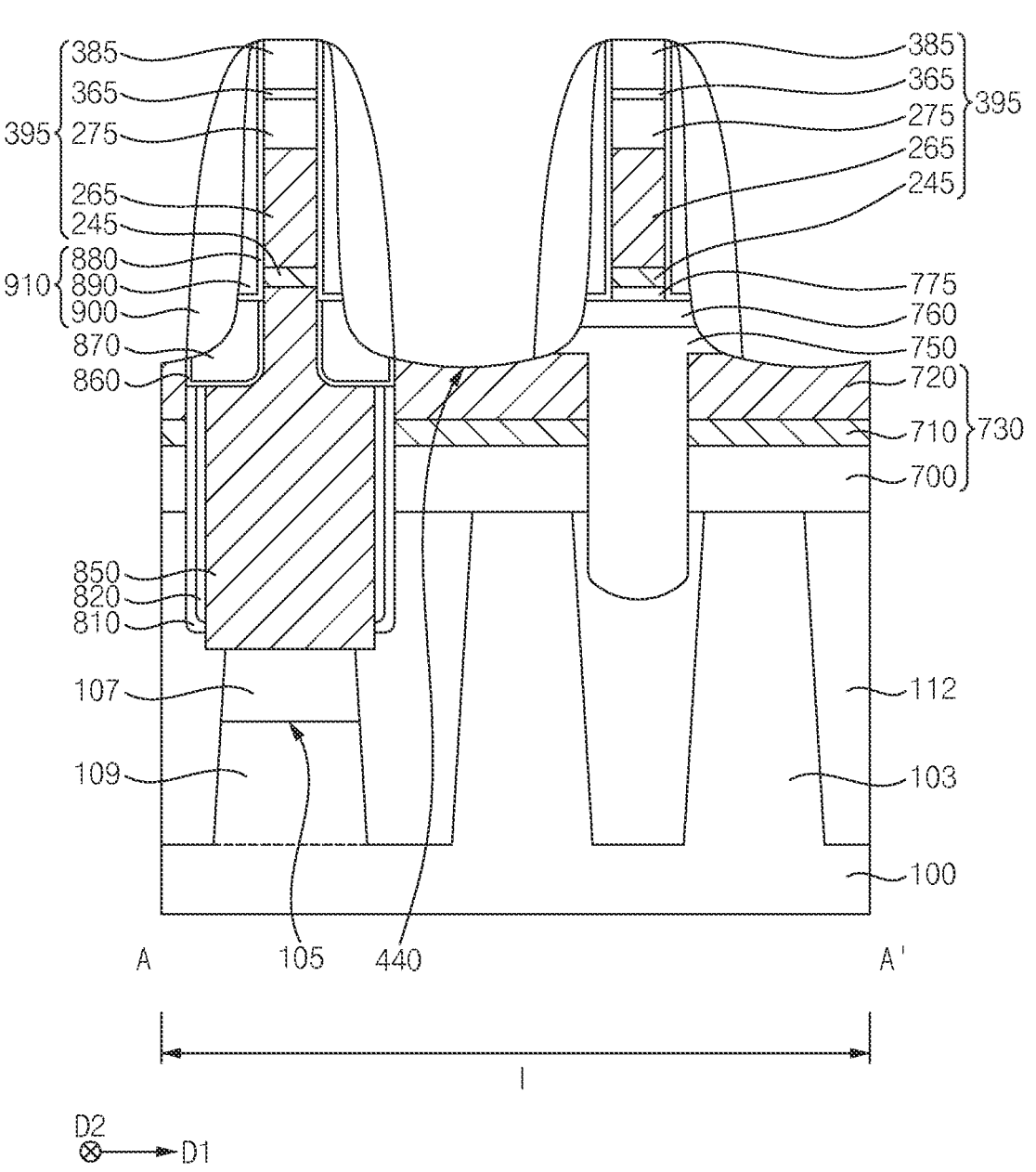

Referring to FIG. 15, first and second upper spacer layers may be sequentially formed on the substrate 100 having the bit line structure 395, the second insulation pad layer 760, the third insulation pad 775, and the filling structure thereon, and may be anisotropically etched to form a first upper spacer 880 covering the sidewall of the bit line structure 395 and upper surfaces of portions of the second capping pattern 860 and the insulating filling pattern 870 included in the filling structure, and a second upper spacer 890 on an outer sidewall of the first upper spacer 880.

A dry etching process may be performed using the bit line structure 395 and the first and second upper spacers 880 and 890 as an etching mask to form a third opening 440 partially extending through the second capping pattern 860, the insulating filling pattern 870, the second insulation pad layer 760, and the first insulation pad layer 750 to partially expose an upper surface of the third conductive pad 720.

A third upper spacer layer may be formed on upper surfaces of the first capping pattern 385 and the first upper spacer 880, an upper surface and an outer sidewall of the second upper spacer 890, an upper surface of a portion of the filling structure, and sidewalls of the first and second insulation pad layers 750 and 760 and the upper surface of the third conductive pad 720 exposed by the third opening 440, and may be anisotropically etched to form a third upper spacer 900 covering the outer sidewall of the second upper spacer 890. The third upper spacer 900 may also cover the upper surface of the portion of the filling structure.

The first to third upper spacers 880, 890, and 900 sequentially stacked on the sidewall of the bit line structure 395 may collectively form a preliminary upper spacer structure 910.

Figure 16:
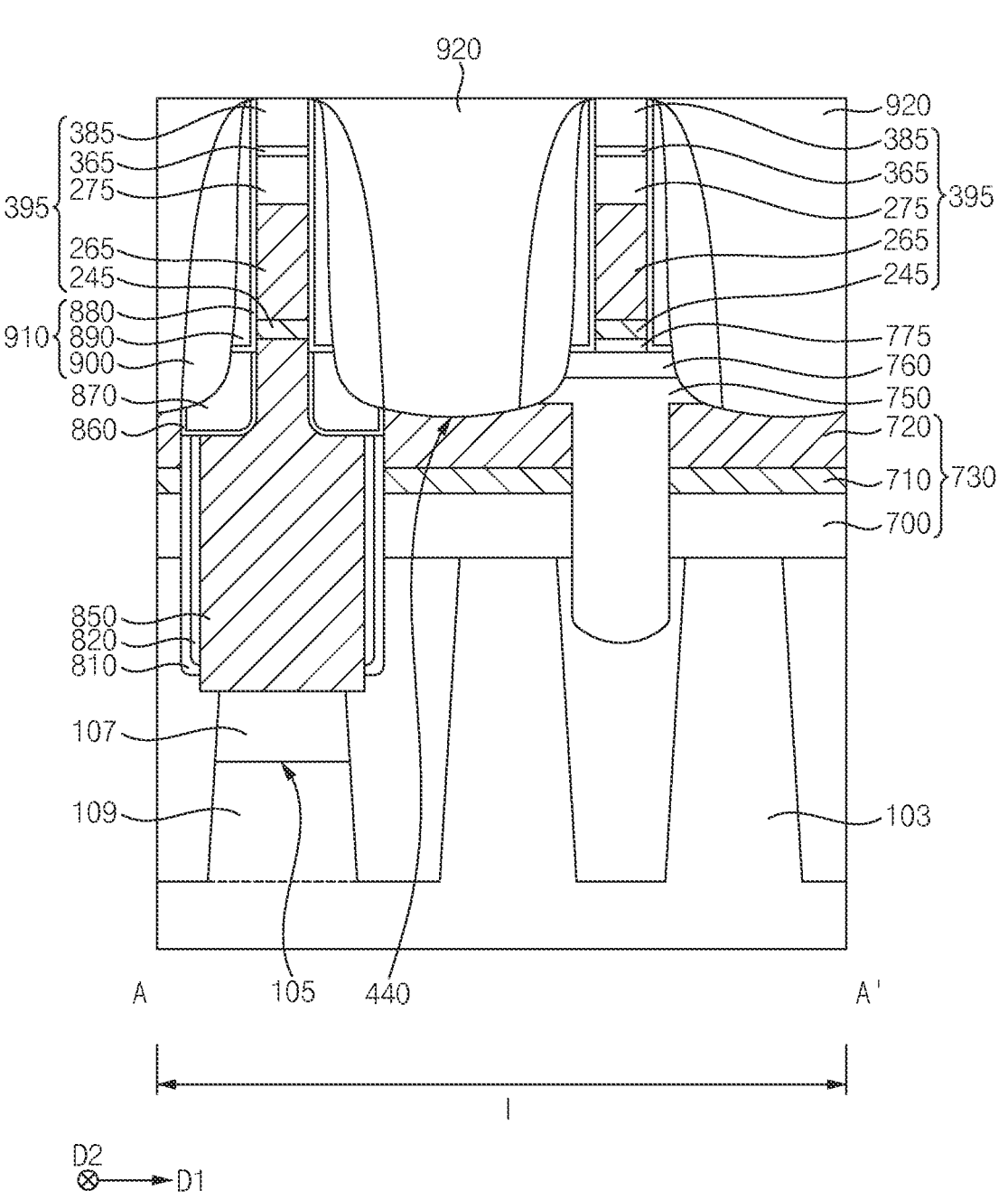

Referring to FIG. 16, a first sacrificial layer may be formed on the substrate 100 to fill the third opening 440, and may be planarized until the upper surface of the first capping pattern 385 is exposed to form a first sacrificial pattern 920. In example embodiments, the first sacrificial pattern 920 may extend in the second direction D2, and a plurality of first sacrificial patterns 920 may be spaced apart from each other in the first direction D1 by the bit line structure 395. The first sacrificial pattern 920 may include an oxide, e.g., silicon oxide.

Figure 17:
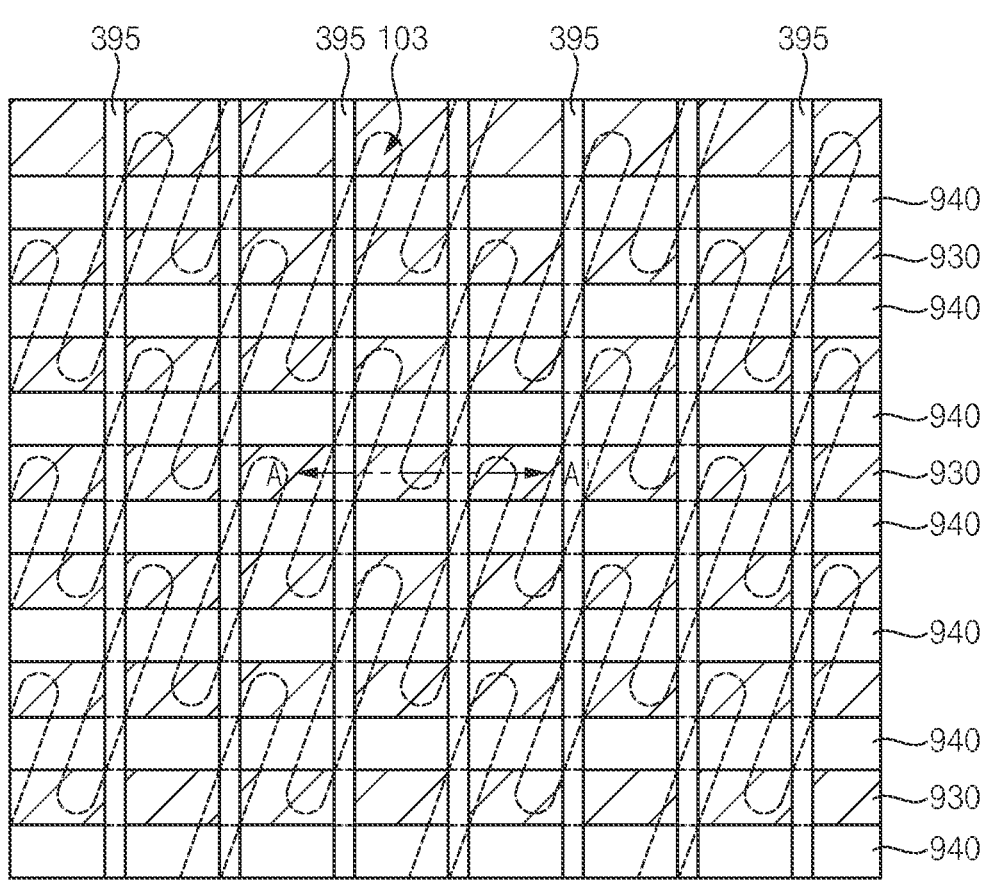
Figure 17:
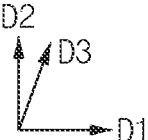
Figure 18:
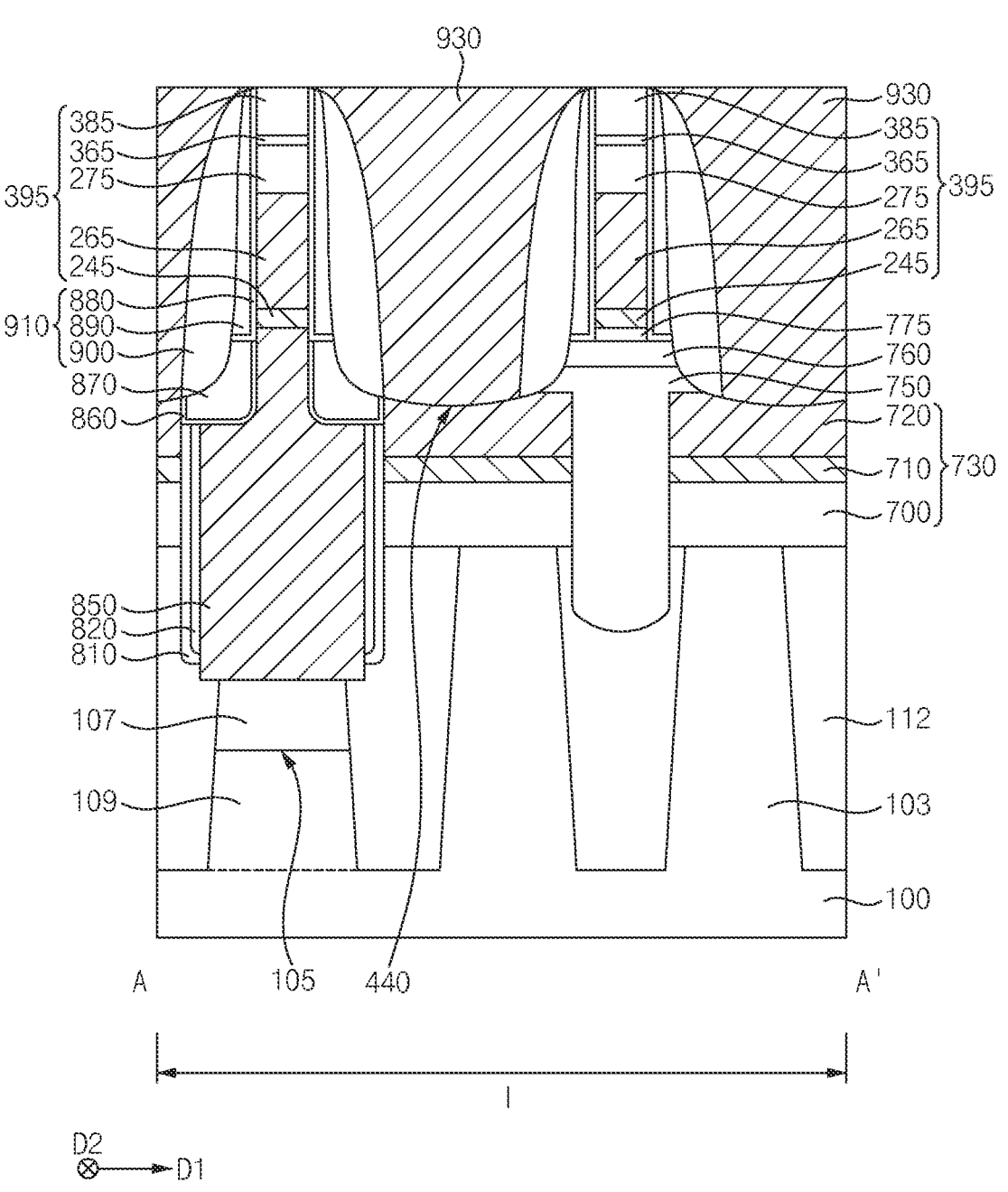

Referring to FIGS. 17 and 18, a third mask including a plurality of fourth openings, each of which may extend in the first direction D1, spaced apart from each other in the second direction D2 may be formed on the first capping pattern 385, the first sacrificial pattern 920, and the preliminary upper spacer structure 910, and the first sacrificial pattern 920 may be etched using the third mask as an etching mask to form a fifth opening exposing an upper surface of the gate mask 160 of the gate structure 170.

In example embodiments, each of the fifth openings may overlap the gate structure 170 in the vertical direction, and a plurality of fifth openings may be spaced apart from each other in the second direction D2 between neighboring ones of the bit line structure 395 in the first direction D1.

After removing the third mask, a third capping pattern 940 may be formed to fill each of the fifth openings. According to the layout of the fifth openings, a plurality of third capping patterns 940 may be spaced apart from each other in the second direction D2 between neighboring ones of the bit line structures 395 in the first direction D1. The third capping pattern 940 may include an insulating nitride, e.g., silicon nitride.

The first sacrificial pattern 920 may be divided into a plurality of parts spaced apart from each other in the second direction D2 between the bit line structures 395.

The first sacrificial patterns 920 may be removed to form sixth openings each of which may partially expose the upper surface of the conductive pad structure 730. A plurality of sixth openings may be spaced apart from each other in the second direction D2 between the bit line structures 395.

A lower contact plug layer may be formed to fill the sixth openings, and may be planarized until upper surfaces of the first and third capping patterns 385 and 940 and the preliminary upper spacer structure 910 are exposed. Thus, the lower contact plug layer may be divided into a plurality of lower contact plugs 930 spaced apart from each other by the third capping patterns 940 between the bit line structures 395.

The lower contact plug 930 may include, e.g., doped polysilicon, and may contact the third conductive pad 720 to be electrically connected to the active pattern 103.

Figure 19:
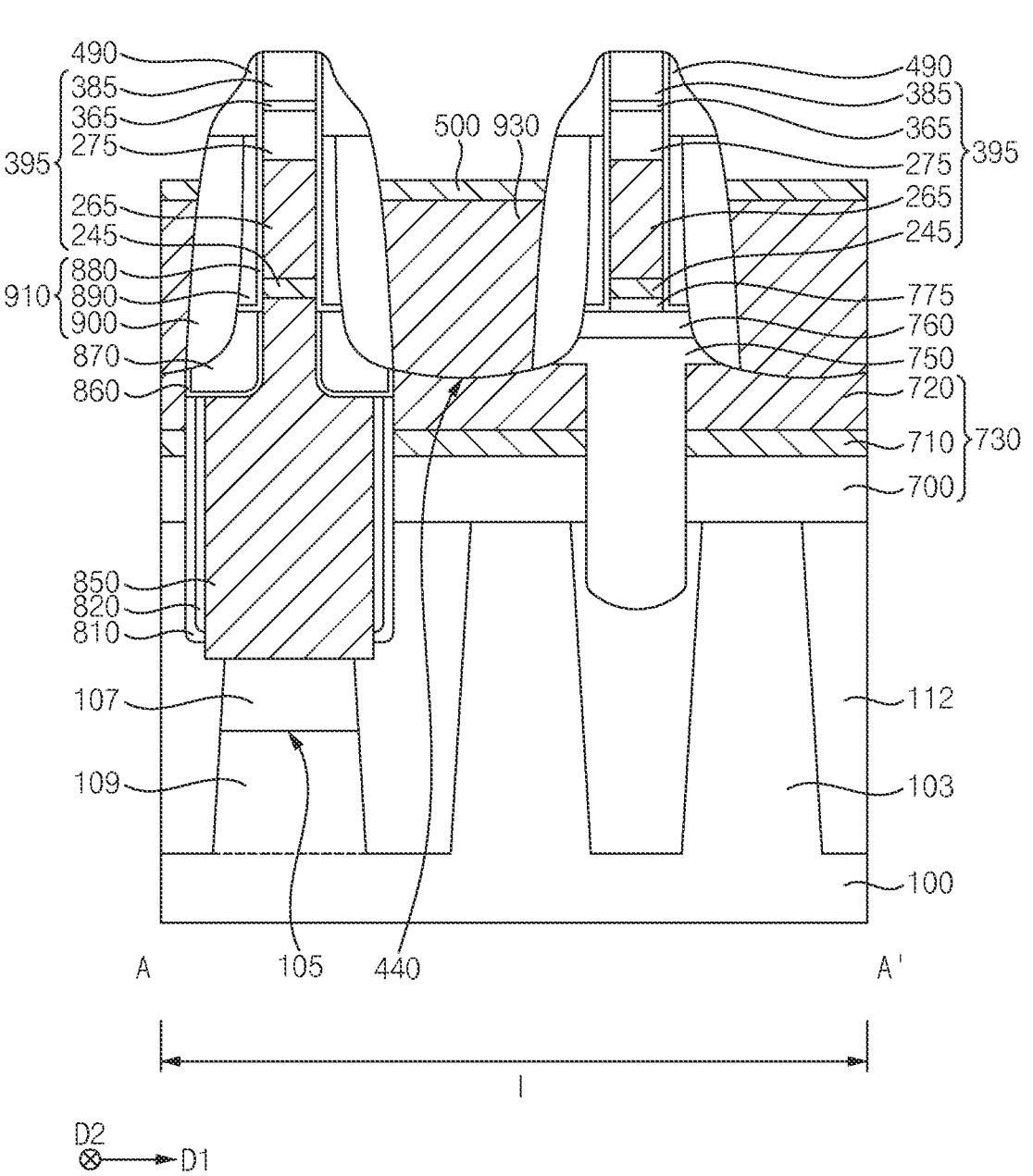

Referring to FIG. 19, an upper portion of the lower contact plug 930 may be removed to expose an upper portion of the preliminary upper spacer structure 910 on the sidewall of the bit line structure 395, and upper portions of the second and third upper spacers 890 and 900 of the preliminary upper spacer structure 910 may be removed.

The upper portion of the lower contact plug 930 may be removed by, e.g., an etch back process, and the upper portions of the second and third upper spacers 890 and 900 may be removed by, e.g., a wet etching process.

A fourth upper spacer layer may be formed on the bit line structure 395, the preliminary upper spacer structure 910, the lower contact plug 930, and the third capping pattern 940, and may be anisotropically etched to form a fourth upper spacer 490 on an outer sidewall of a portion of the first upper spacer 880 on the upper sidewall of the bit line structure 395.

The fourth upper spacer 490 may cover an upper surface of the second upper spacer 890 and an upper surface of at least a portion of the third upper spacer 900. Thus, during the anisotropic etching process, an upper portion of the lower contact plug 930 may be partially removed, and a portion of the third upper spacer 900 not covered by the fourth upper spacer 490 may also be removed.

In an example embodiment, a fifth upper spacer layer may be formed on the bit line structure 395, the first upper spacer 880, the fourth upper spacer 490, the lower contact plug 930, and the third capping pattern 940, may be anisotropically etched to form a fifth upper spacer on a sidewall of the fourth upper spacer 490, and an etching process may be performed using the bit line structure 395, the first upper spacer 880, the fourth upper spacer 490, the lower contact plug 930, the third capping pattern 940 and the fifth upper spacer as an etching mask to further remove an upper portion of the lower contact plug 930. Thus, an upper surface of the lower contact plug 930 may be lower than uppermost surfaces of the second and third upper spacers 890 and 900.

An ohmic contact pattern 500 may be formed on the upper surface of the lower contact plug 930. In example embodiments, the ohmic contact pattern 500 may be formed by forming a first metal layer on the bit line structure 395, the first upper spacer 880, the fourth upper spacer 490, the lower contact plug 930, and the third capping pattern 940, and performing a heat treatment on the first metal layer, that is, by performing a silicidation process in which the first metal layer including a metal and the lower contact plug 930 including silicon are reacted with each other, and removing an unreacted portion of the first metal layer.

The ohmic contact pattern 500 may include a metal silicide, e.g., cobalt silicide, nickel silicide, titanium silicide, etc.

Figure 20:
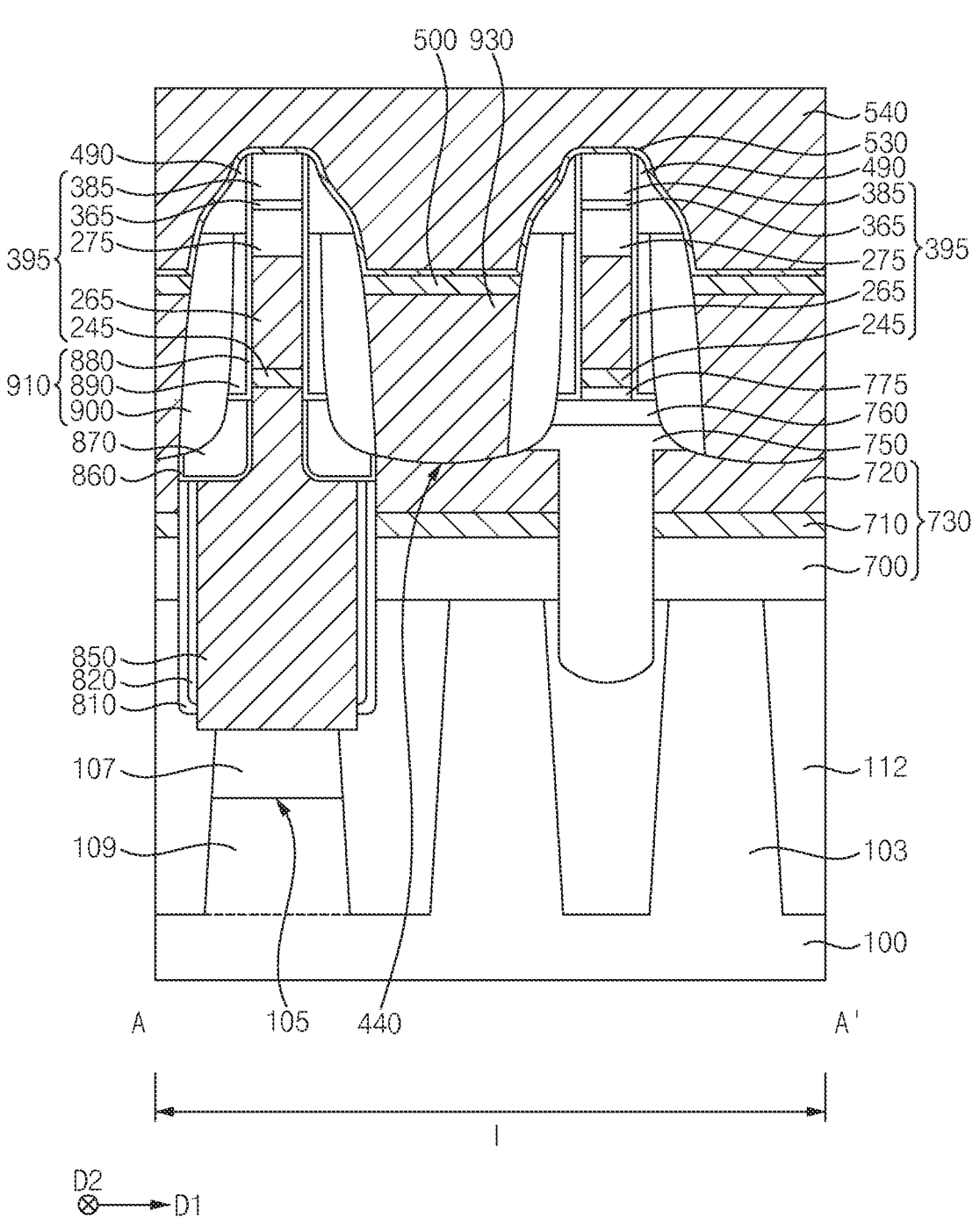

Referring to FIG. 20, a second barrier layer 530 may be formed on the bit line structure 395, the first upper spacer 880, the fourth upper spacer 490, the ohmic contact pattern 500, and the third capping pattern 940, and a second metal layer 540 may be formed on the second barrier layer 530 to fill a space between the bit line structures 395.

A planarization process may be performed on an upper portion of the second metal layer 550. The planarization process may include a CMP process and/or an etch back process.

Referring to FIGS. 21 and 22, the second metal layer 540 and the second barrier layer 530 may be patterned to form an upper contact plug 549, and a seventh opening 547 may be formed between a plurality of upper contact plugs 549.

During the formation of the seventh opening 547, not only the second metal layer 540 and the second barrier layer 530 may be partially removed but also an upper portion of the insulation structure included in the bit line structure 395, the preliminary upper spacer structure 910 and the fourth upper spacer 490 on the sidewall thereof, and the third capping pattern 940 may also be partially removed, and thus an upper surface of the second upper spacer 890 may be exposed.

As the seventh opening 547 is formed, the second metal layer 540 and the second barrier layer 530 may be transformed, respectively, into a second metal pattern 545 and a second barrier pattern 535 covering a lower surface and a sidewall of the second metal pattern 545, which may form the upper contact plug 549. In example embodiments, the plurality of upper contact plugs 549 may be spaced apart from each other in the first and second directions D1 and D2, and may be arranged in a honeycomb pattern or a lattice pattern in a plan view. Each of the upper contact plugs 549 may have a shape of a circle, an ellipse, or a polygon in a plan view.

The lower contact plug 930, the ohmic contact pattern 500, and the upper contact plug 549 sequentially stacked on the substrate 100 may collectively form a contact plug structure.

The second upper spacer 890 may be removed to form an air gap 895 connected to the seventh opening 547. The second upper spacer 890 may be removed by, e.g., a wet etching process.

In example embodiments, not only a first portion of the second upper spacer 890 on the sidewall of the bit line structure 395 extending in the second direction D2, which are directly exposed by the seventh opening 547, but also a second portion of the second upper spacer 890 that is parallel to the first portion in the horizontal direction may be removed. That is, not only the portion of the second upper spacer 890 exposed by the seventh opening 547 not to be covered by the upper contact plug 549 may be removed but also a portion of the second upper spacer 890 covered by the upper contact plug 549 may be removed.

Referring to FIGS. 1 and 2 again, a first insulation pattern 615 may be formed on an inner wall of the seventh opening 547, and a second insulation pattern 620 may be formed on the first insulation pattern 615 to fill a remaining portion of the seventh opening 547. Thus, a top end of the air gap 895 may be closed.

The air gap 895 may also be referred to as an air spacer 895, and the first upper spacer 880, the air spacer 895, and the third upper spacer 900 may collectively form an upper spacer structure 915.

The first and second insulation patterns 615 and 620 may form an insulation pattern structure.

A fourth etch stop layer 630 may be formed on the first and second insulation patterns 615 and 620, the upper contact plug 549, and the third capping pattern 940, and a mold layer may be formed on the fourth etch stop layer 630. A portion of the mold layer and a portion of the fourth etch stop layer 630 thereunder may be removed to form an eighth opening exposing an upper surface of the upper contact plug 549.

As the upper contact plugs 549 are arranged in a honeycomb pattern or a lattice pattern in a plan view, the eighth openings exposing the upper contact plugs 549, respectively, may also be arranged in the honeycomb pattern or the lattice pattern in a plan view.

A lower electrode layer may be formed on the upper surface of the upper contact plug 549 exposed by the eighth opening, a sidewall of the eighth opening and an upper surface of the mold layer, a second sacrificial layer may be formed on the lower electrode layer to fill a remaining portion of the eighth opening, and the second sacrificial layer and the lower electrode layer may be planarized until the upper surface of the mold layer is exposed so that the lower electrode layer may be divided into a plurality of pieces.

Accordingly, a lower electrode 640 may be formed to have a shape of a cylinder in the eighth opening. However, if the eighth opening has a small width, the lower electrode 640 may have a shape of a pillar.

The second sacrificial layer and the mold layer may be removed by a wet etching process using, e.g., LAL solution (e.g., a mixture of hydrogen fluoride (HF) and ammonium fluoride ($NH_4F$)) as an etching solution.

A dielectric layer 650 may be formed on a surface of the lower electrode 640 and an upper surface of the fourth etch stop layer 630. The dielectric layer 650 may include, e.g., a metal oxide.

An upper electrode 660 may be formed on the dielectric layer 650. The upper electrode 660 may include, e.g., a metal, a metal nitride, a metal silicide, doped silicon-germanium. In an example embodiment, the upper electrode 660 may include a first upper electrode containing a metal or a metal nitride and a second upper electrode containing doped silicon-germanium.

The lower electrode 640, the dielectric layer 650, and the upper electrode 660 may collectively form a capacitor 670.

Upper wirings may be further formed on the capacitor 670 so that the fabrication of the semiconductor device may be completed.

As illustrated above, the second opening 805 exposing the upper surface of the central portion in the third direction D3 of the active pattern 103 may be formed, the upper portion of the central portion of the active pattern 103 exposed by the second opening 805 may be further removed to form the third recess 105, and an SEG process may be performed to form the epitaxial layer 107 in the third recess 105.

The epitaxial layer 107 may include single crystalline silicon doped with n-type impurities, and the n-type impurities may diffuse into the portion of the active pattern 103 under the third recess 105 to form the impurity region 109.

Thus, the impurity region 109, which may be formed under the central portion of the active pattern 103 contacting the conductive filling pattern 850 electrically connected to the bit line structure 395, may be close to the upper portion of the substrate 100, and thus, the charges at the upper portion of the substrate 100 may move to the central portion of the active pattern 103 in which the impurity region 109 is formed, instead of moving to the end portions in the third direction D3 of the active pattern 103 contacting the conductive pad structure 730 electrically connected to the lower contact plug 930. Accordingly, the leakage current from the upper portion of the substrate 100 to the lower contact plug 930, that is, the GIJL may be reduced or prevented.

Additionally, if the upper surface of the central portion of the active pattern 103 exposed by the second opening 805 has a small area, an impurity region that may be formed by doping impurities into the central portion of the active pattern 103 through the second opening 805 may not have a sufficient concentration of impurities.

However, in example embodiments, the upper portion of the central portion of the active pattern 103 may be further removed to form the third recess 105, and an SEG process may be performed to form the epitaxial layer 107 including single crystalline silicon doped with impurities. Thus, the epitaxial layer 107 may include impurities having a sufficiently high concentration. Furthermore, during the formation of the epitaxial layer 107, the impurities may diffuse into the portion of the active pattern 103 under the epitaxial layer 107 to form the impurity region 109, and thus an area having a sufficiently large amount of impurities may be acquired.

Figure 23:
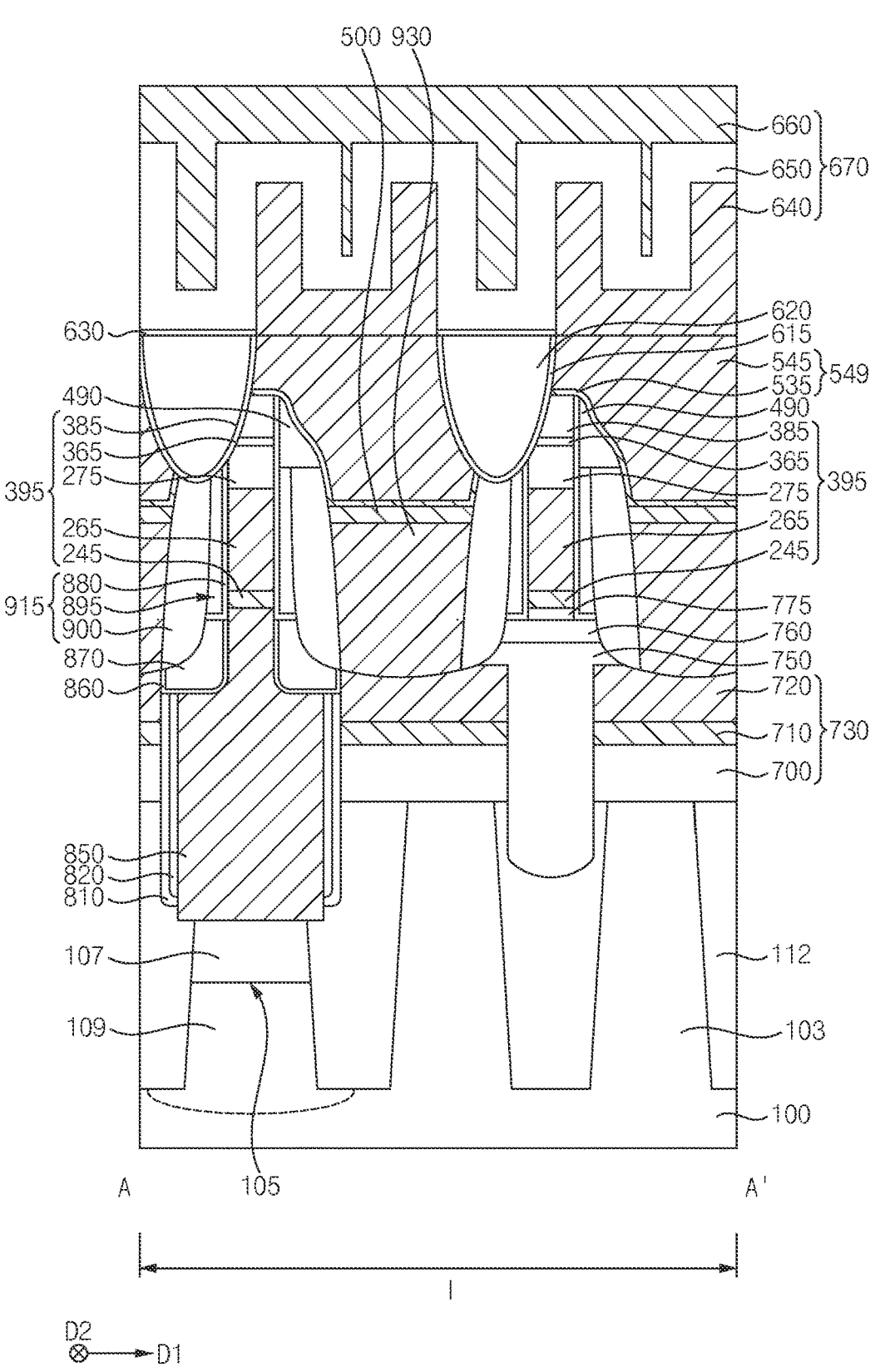
FIGS. 23 and 24 are cross-sectional views illustrating semiconductor devices, respectively, in accordance with example embodiments.
Figure 24:
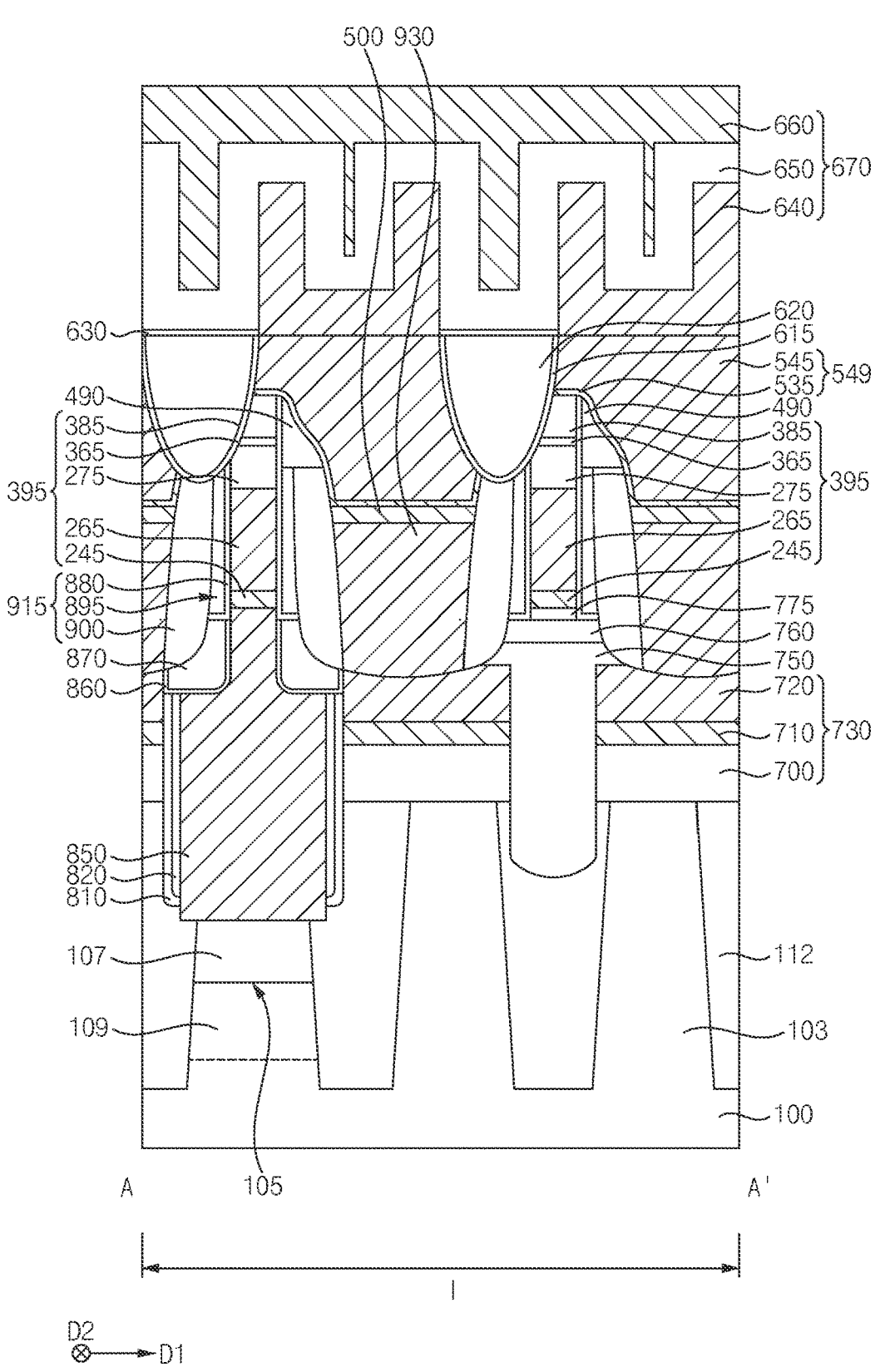

FIGS. 23 and 24 are cross-sectional views illustrating semiconductor devices, respectively, in accordance with example embodiments, which may correspond to FIG. 2.

These semiconductor devices may be substantially the same as that of FIGS. 1 and 2, except for the location of the impurity region 109, and thus repeated explanations are omitted herein.

Referring to FIG. 23, a lower surface of the impurity region 109 may be lower than that of the active pattern 103.

Referring to FIG. 24, the lower surface of the impurity region 109 may be higher than that of the active pattern 103.

For example, during the formation of the epitaxial layer 107 in the third recess 105 by an SEG process or during processes for forming other structures, n-type impurities of the epitaxial layer 107 may diffuse into the portion of the active pattern 103 under the epitaxial layer 107 by heat, and according to a degree of the diffusion of the n-type impurities, the lower surface of the impurity region 109 may be substantially coplanar with, or lower or higher than that of the active pattern 103.

Figure 25:
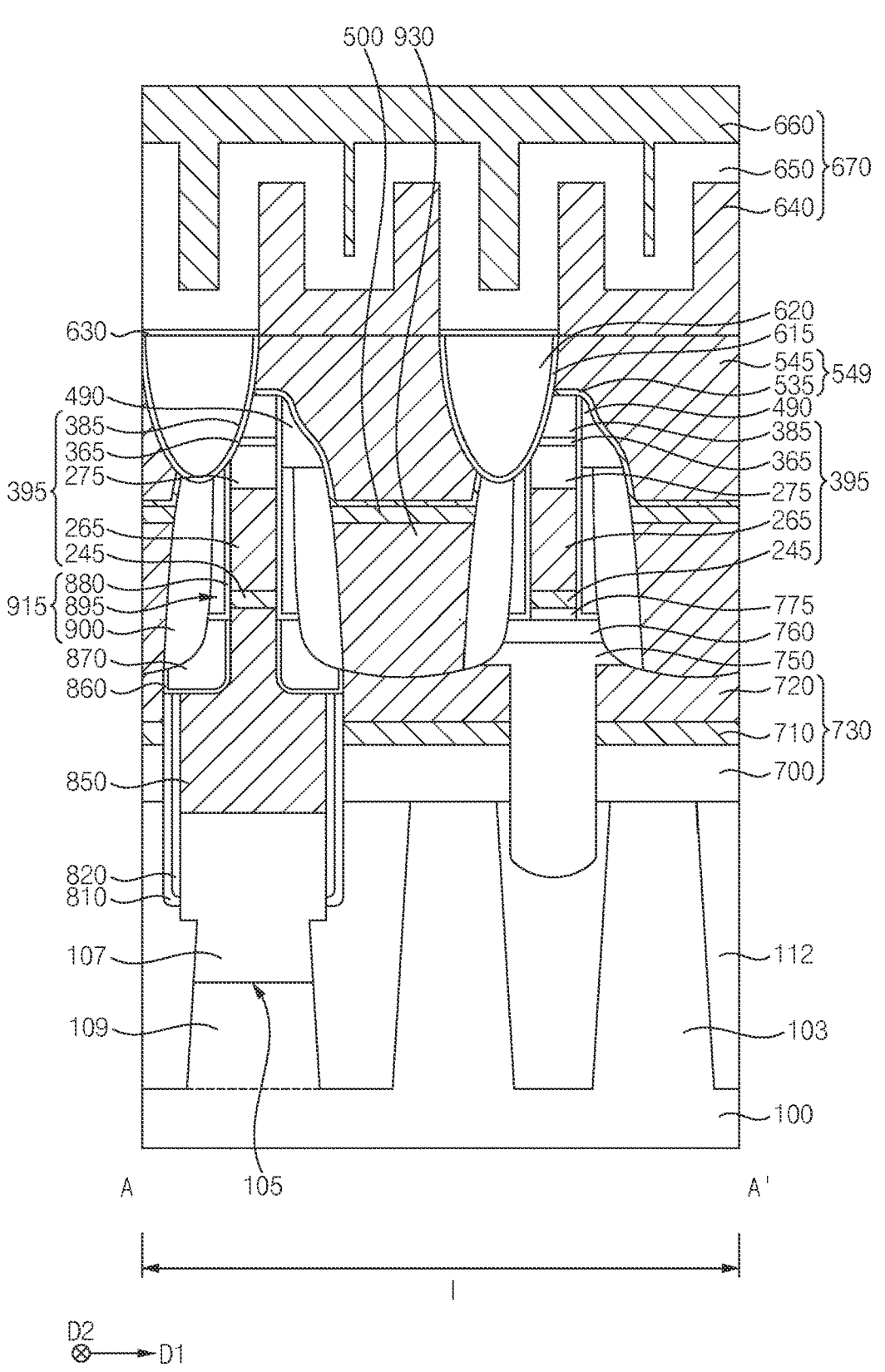
FIG. 25 is a cross-sectional view illustrating a semiconductor device in accordance with example embodiments.

FIG. 25 is a cross-sectional view illustrating a semiconductor device in accordance with example embodiments, which may correspond to FIG. 2.

This semiconductor device may be substantially the same as that of FIGS. 1 and 2, except for the location and shape of the epitaxial layer 107, and thus repeated explanations are omitted herein.

Referring to FIG. 25, the epitaxial layer 107 may include a lower portion in the third recess 105 and an upper portion in the second opening 805 (refer to FIG. 9).

In example embodiments, the upper portion of the epitaxial layer 107 may have a width that is greater than that of the lower portion of the epitaxial layer 107. A sidewall of the upper portion of the epitaxial layer 107 may be covered by the lower spacer structure.

During the SEG process illustrated with reference to FIG. 10, the epitaxial layer 107 may be formed not only in the third recess 105 but also in a lower portion of the second opening 805, so that the epitaxial layer 107 may include the lower portion and the upper portion.

Figure 26:
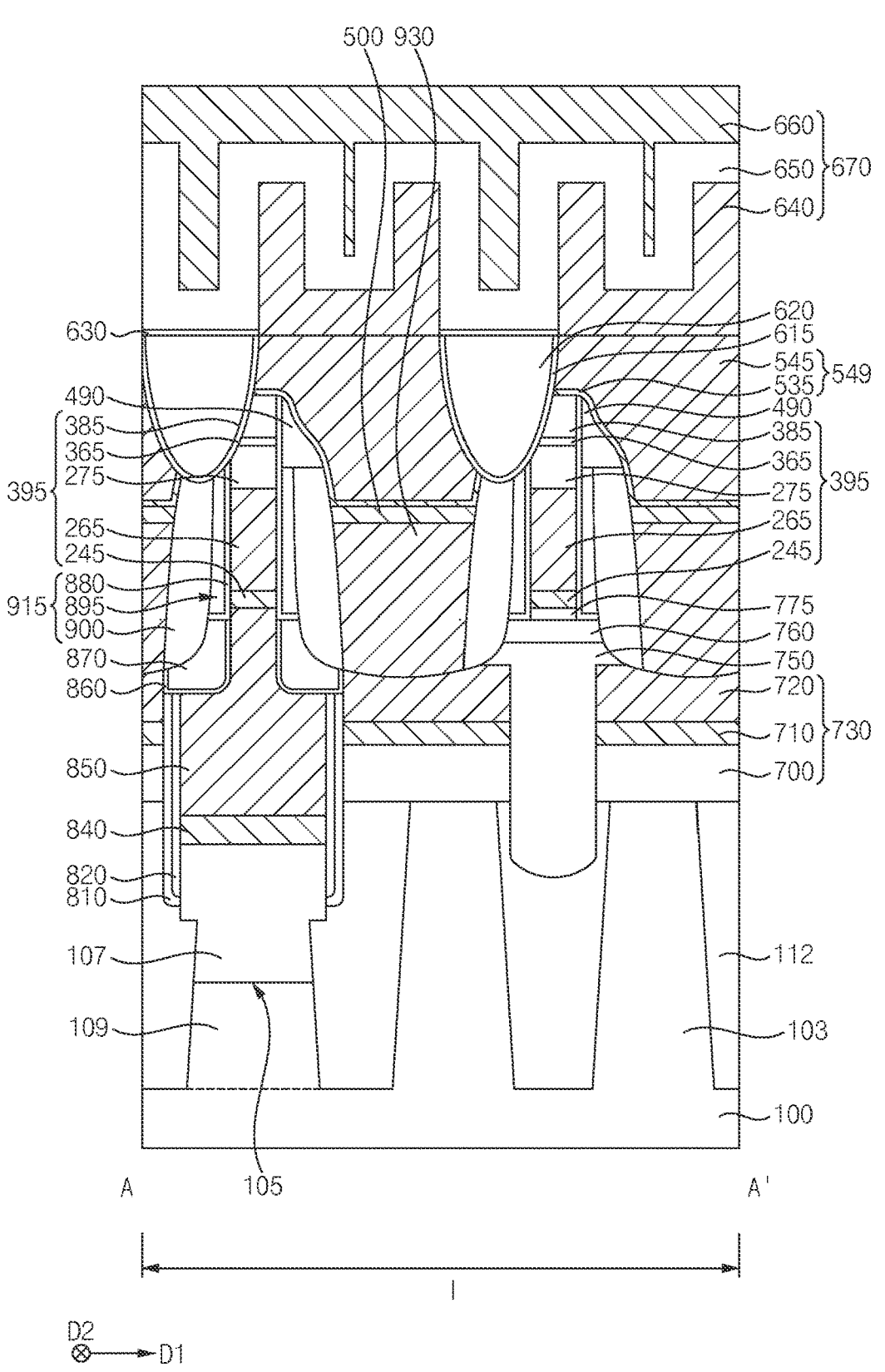
FIG. 26 is a cross-sectional view illustrating a semiconductor device in accordance with example embodiments.

FIG. 26 is a cross-sectional view illustrating a semiconductor device in accordance with example embodiments, which may correspond to FIG. 25.

This semiconductor device may be substantially the same as that of FIG. 25, except for further including a metal silicide pattern, and thus repeated explanations are omitted herein.

Referring to FIG. 26, a metal silicide pattern 840 may be formed between the epitaxial layer 107 and the conductive filling pattern 850.

The metal silicide pattern 840 may include, e.g., cobalt silicide, titanium silicide, nickel silicide, etc. When the conductive filling pattern 850 includes, e.g., a metal, the metal silicide pattern 840 may be formed between the epitaxial layer 107 including single crystalline silicon doped with n-type impurities and the conductive filling pattern 850, and may enhance the ohmic characteristics therebetween.

The metal silicide pattern 840 may be formed by forming a metal layer on the epitaxial layer 107 and performing a heat treatment on the metal layer.

Figure 27:
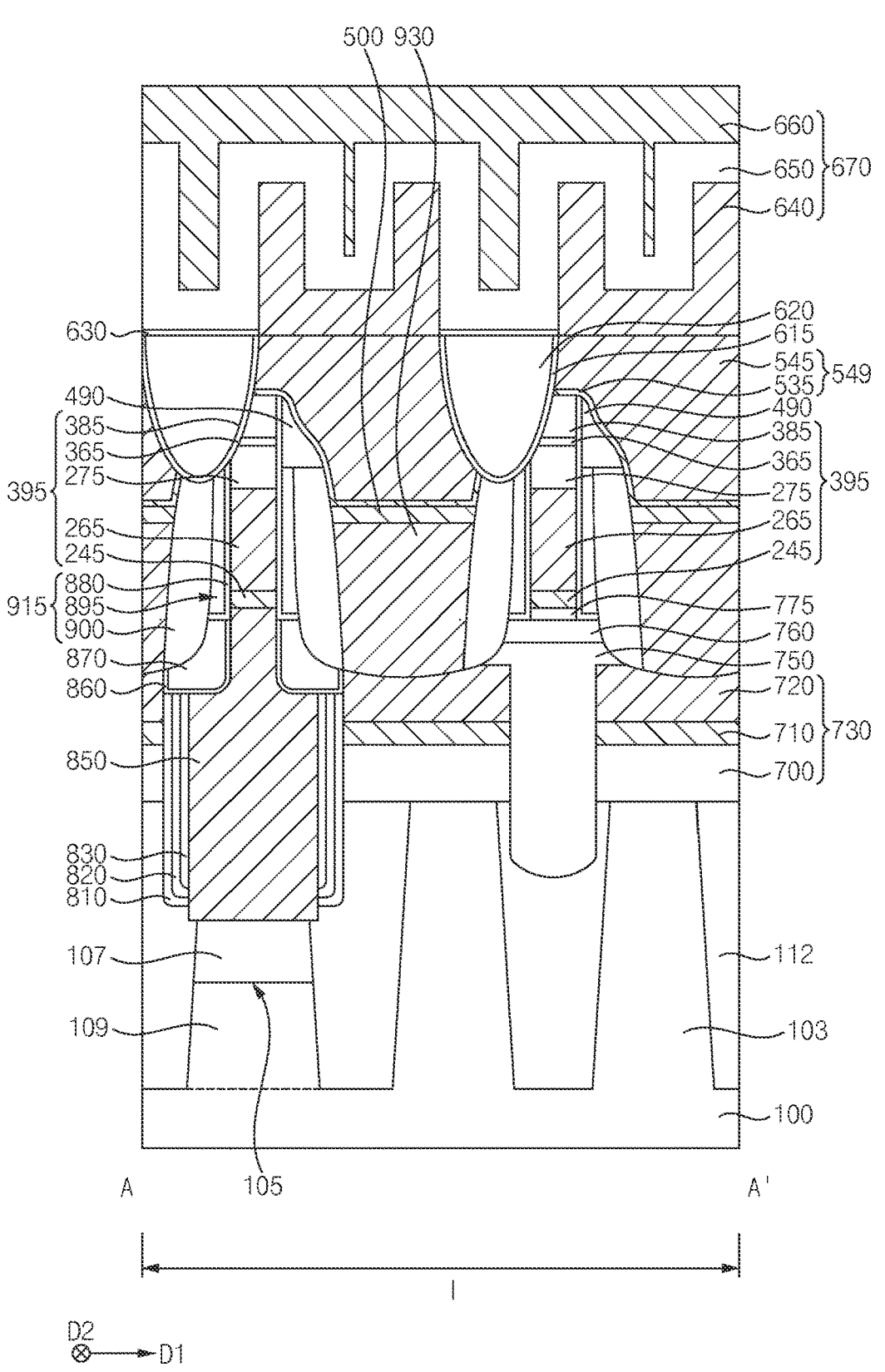
FIG. 27 is a cross-sectional view illustrating a semiconductor device in accordance with example embodiments.

FIG. 27 is a cross-sectional view illustrating a semiconductor device in accordance with example embodiments, which may correspond to FIG. 2.

This semiconductor device may be substantially the same as that of FIGS. 1 and 2, except for the lower spacer structure, and thus repeated explanations are omitted herein.

Referring to FIG. 27, the lower spacer structure may further include a third lower spacer 830 between a sidewall of the conductive filling pattern 850 and the second lower spacer 820.

In example embodiments, the third lower spacer 830 may include an insulating nitride, e.g., silicon nitride.

Figure 28:
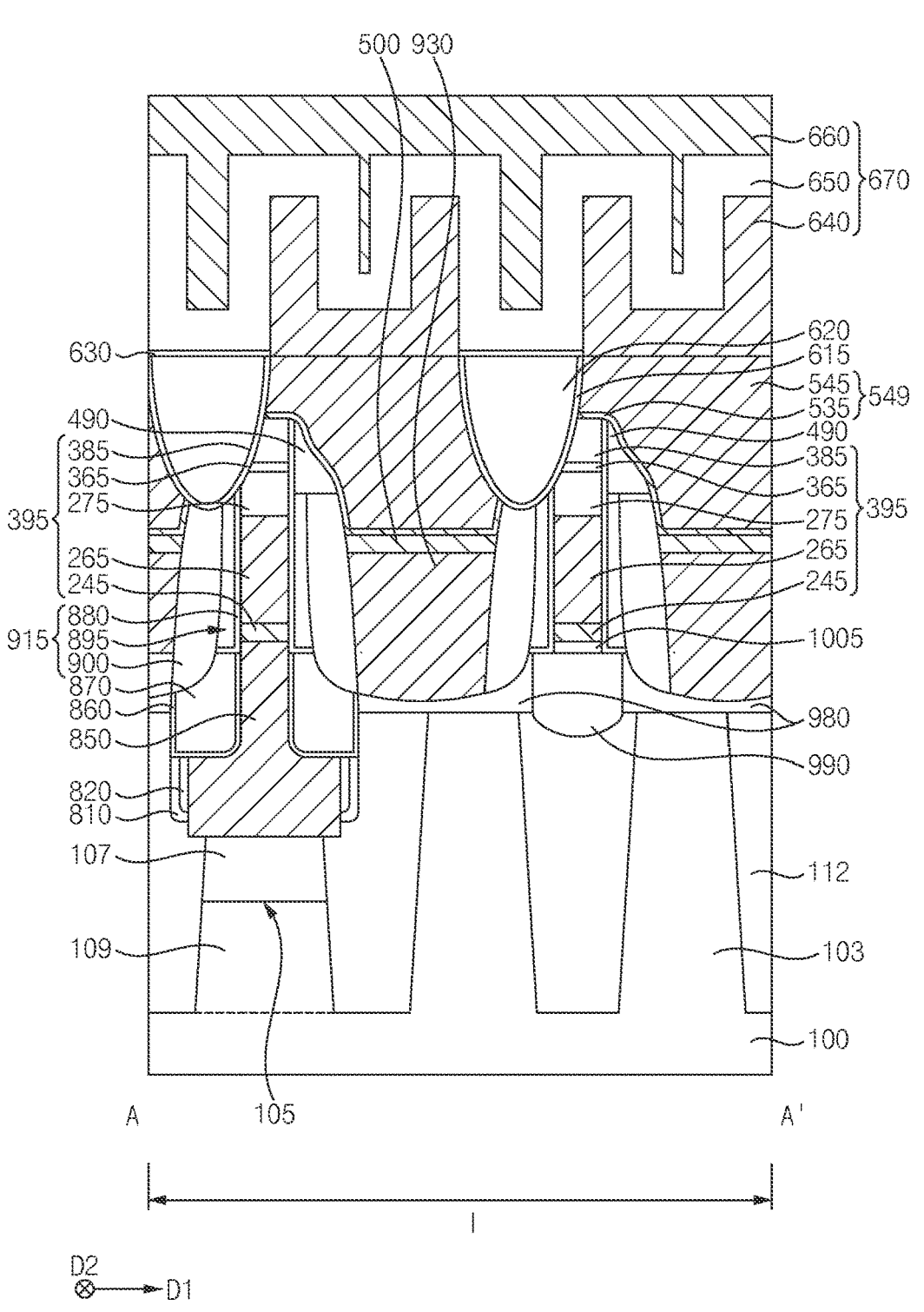
FIG. 28 is a cross-sectional view illustrating a semiconductor device in accordance with example embodiments.

FIG. 28 is a cross-sectional view illustrating a semiconductor device in accordance with example embodiments, which may correspond to FIG. 2.

This semiconductor device may be substantially the same as that of FIGS. 1 and 2, except for some elements, and thus repeated explanations are omitted herein.

Referring to FIG. 28, a fourth conductive pad 980 and a fourth insulation pad 990 may be formed on the active pattern 103, the isolation pattern 112 and the gate structure 170.

Figure 29:
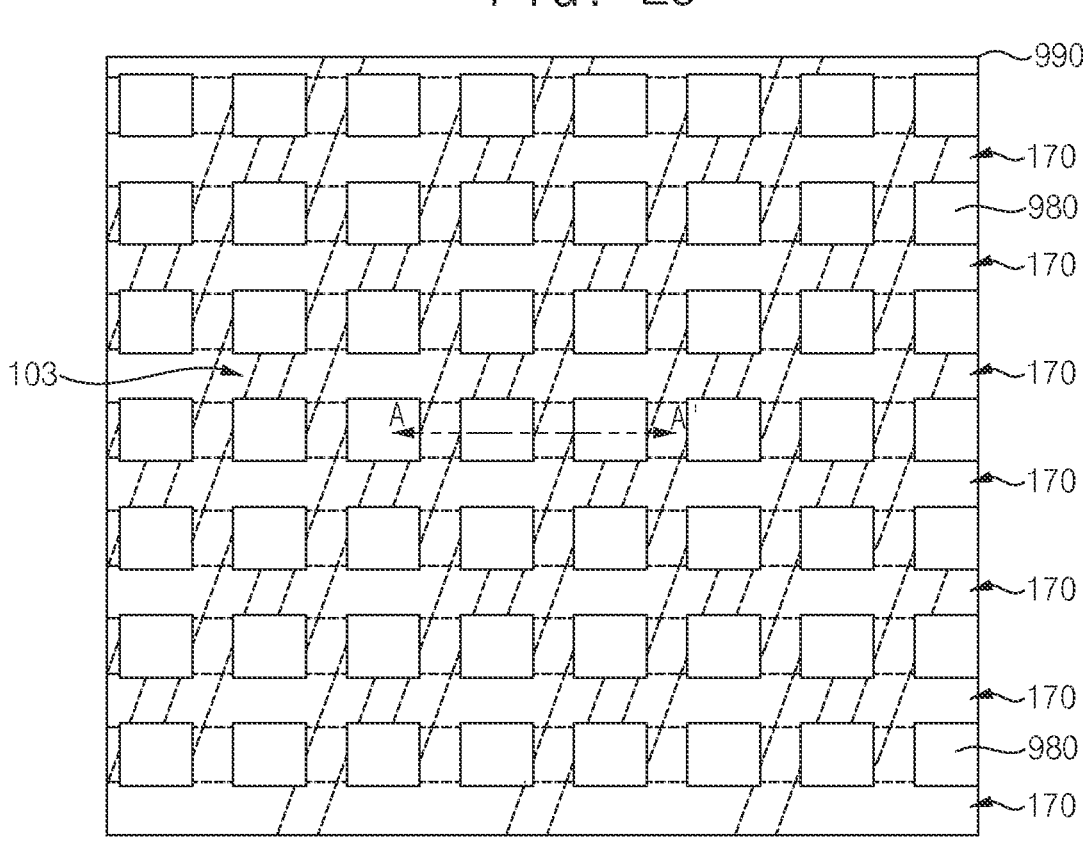
FIGS. 29 to 33 are plan views and cross-sectional views illustrating a method of manufacturing a semiconductor device in accordance with example embodiments.
Figure 29:
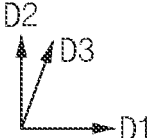
Figure 30:
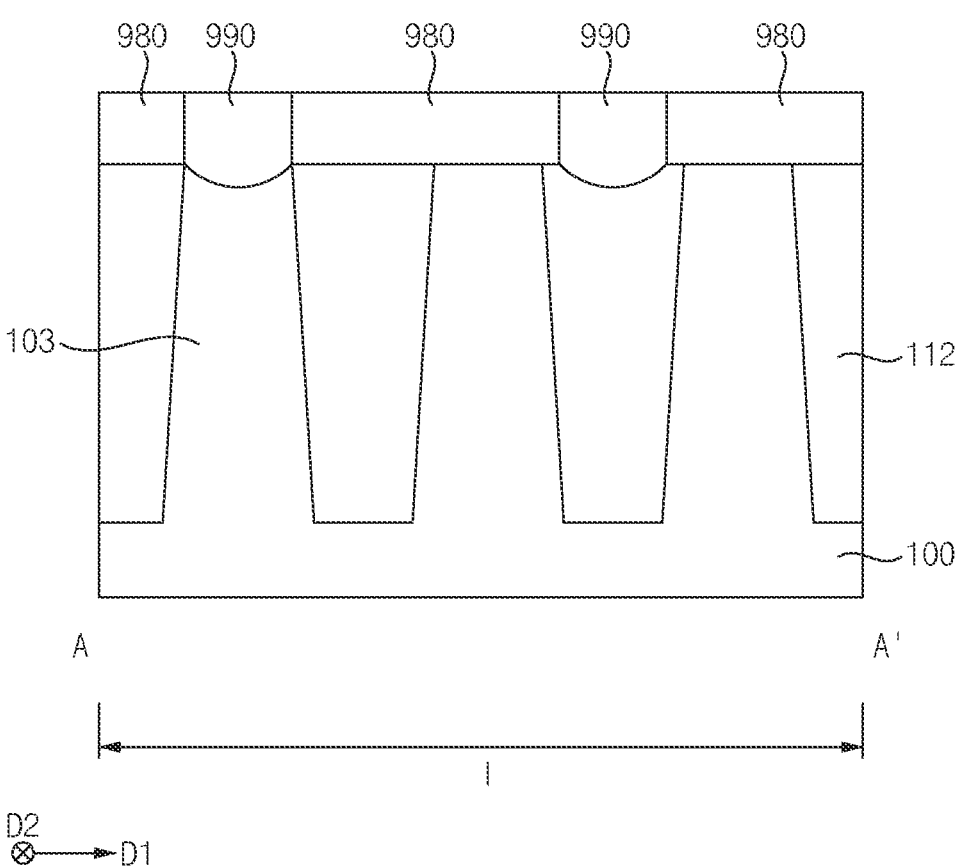

Referring to FIG. 28 together with FIGS. 29 and 30, in example embodiments, a plurality of fourth conductive pads 980 may be spaced apart from each other in the first and second directions D1 and D2, and may be arranged in a lattice pattern.

The fourth insulation pad 990 may include a first extension portion extending in the first direction D1 and a second extension portion extending in the second direction D2, which may be connected with each other. Thus, each of the fourth conductive pads 980 may be surrounded by the fourth insulation pad 990.

In example embodiments, the fourth conductive pads 980 may overlap in the vertical direction an end portion in the third direction D3 of each of the active patterns 103 and a portion of the isolation pattern 112 adjacent thereto in the first direction D1.

The fourth conductive pad 980 may include, e.g., doped polysilicon, a metal such as tungsten, ruthenium, etc., a metal nitride such as titanium nitride, tantalum nitride, etc., or a conductive material such as graphene. In an example embodiment, the fourth conductive pad 980 may be a single layer including one of the above materials. Alternatively, the fourth conductive pad 980 may be a multi-layered structure including ones of the above materials, respectively. FIG. 30 shows that the fourth conductive pad 980 is a single layer.

The fourth insulation pad 990 may include an insulating nitride, e.g., silicon nitride.

The filling structure may be formed in the second opening 805 (refer to FIGS. 32 and 33) extending through the fourth conductive pad 980, the fourth insulation pad 990, an upper portion of the active pattern 103, an upper portion of the isolation pattern 112 and an upper portion of the gate structure 170, and may include the conductive filling patterns 850, the lower spacer structure, the second capping pattern 860 and the insulating filling pattern 870, as in FIGS. 1 and 2.

The bit line structure 395 may be formed on the filling structure, and a fifth insulation pad 1005 may be formed between a portion of the bit line structure 395 at an outside of the second opening 805 and the fourth insulation pad 990. The fifth insulation pad 1005 may include an insulating nitride, e.g., silicon nitride.

Figure 31:
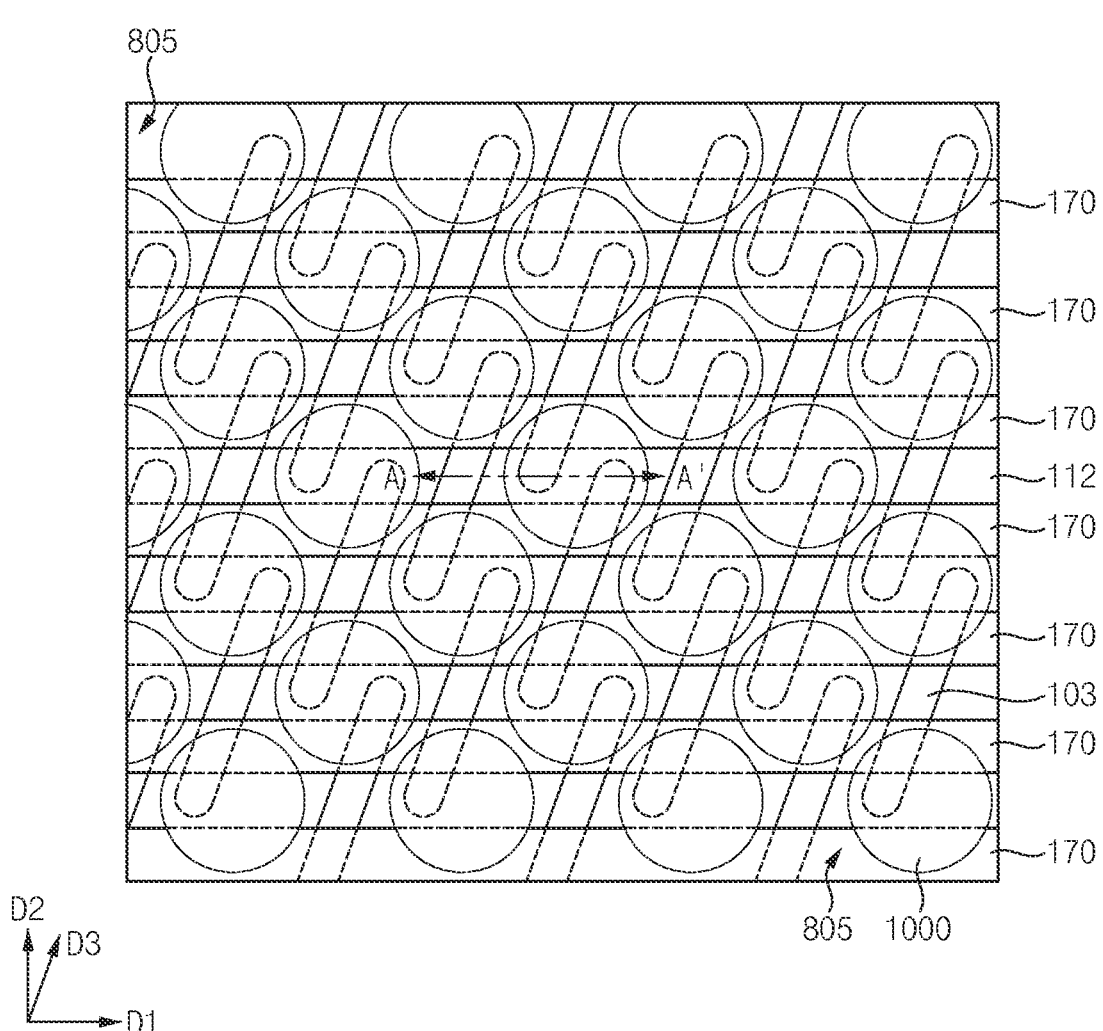
Figure 32:
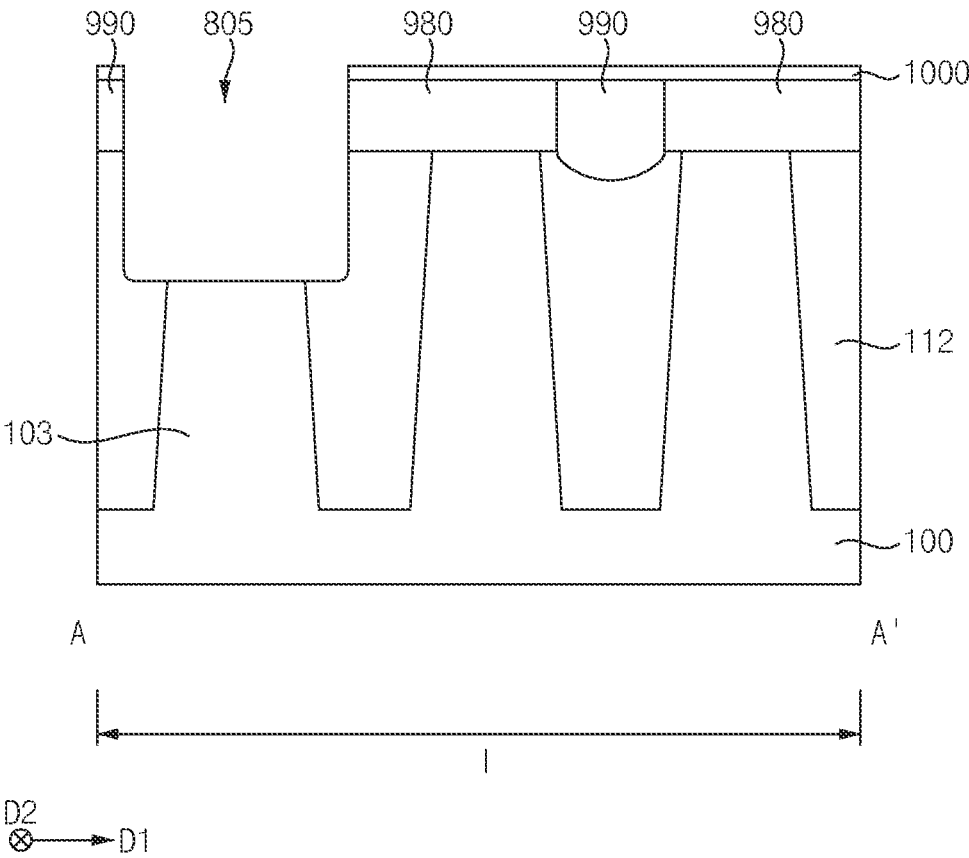
Figure 33:
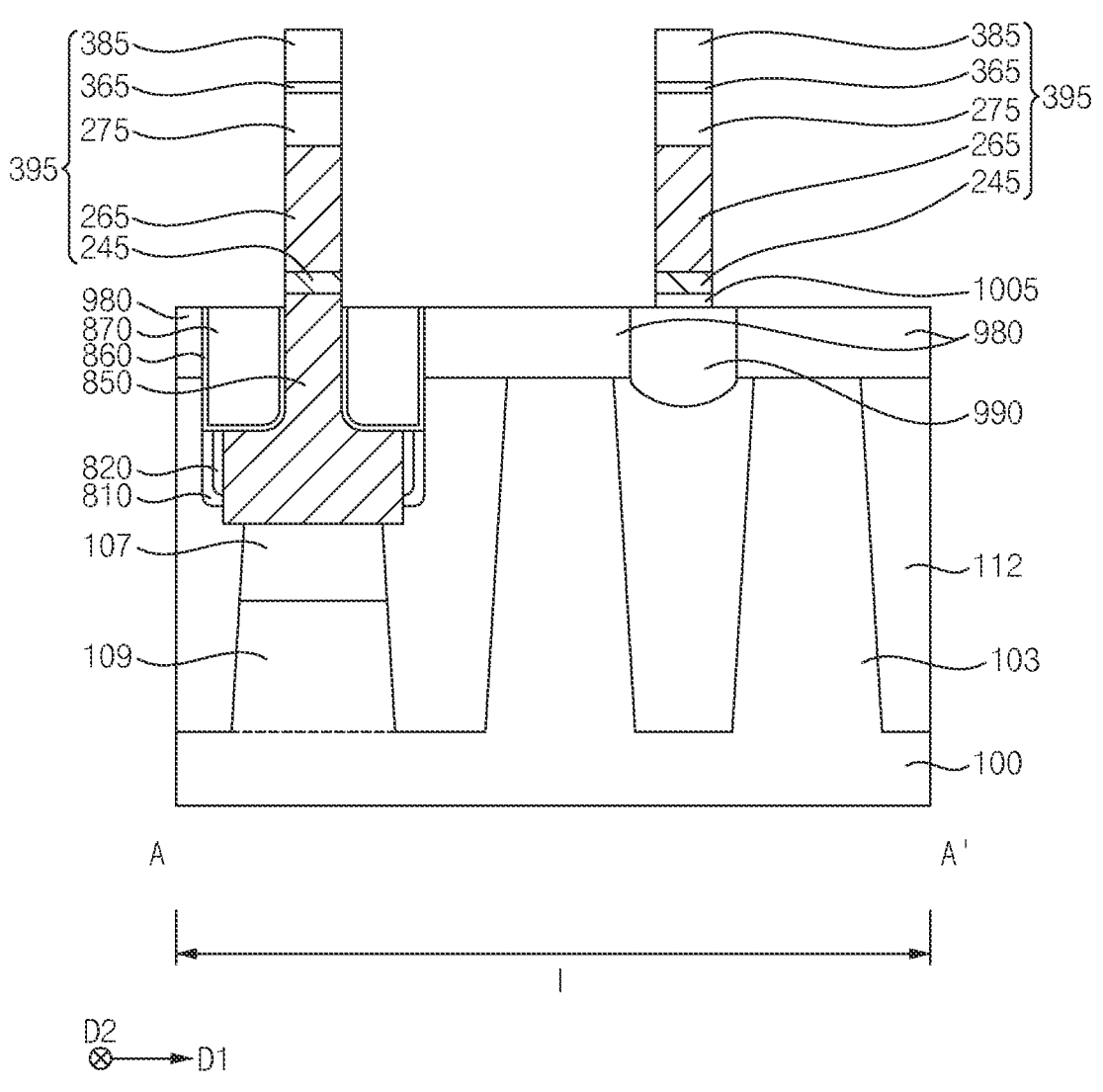

FIGS. 29 to 33 are plan views and cross-sectional views illustrating a method of manufacturing a semiconductor device in accordance with example embodiments. Particularly, FIGS. 29 and 31 are plan views, and FIGS. 30, 32 and 33 are cross-sectional views taken along lines A-A' of corresponding plan views, respectively.

This method may include processes substantially the same as those illustrated with reference to FIGS. 1 to 24, and thus repeated explanations are omitted herein.

Referring to FIGS. 29 and 30, processes substantially the same as those illustrated with reference to FIGS. 3 and 4 may be performed, and a fourth conductive pad 980 and a fourth insulation pad 990 may be formed on the substrate 100 having the active pattern 103, the isolation pattern 112, and the gate structure 170.

In example embodiments, a fourth conductive pad layer may be formed on the substrate 100, the fourth conductive pad layer may be patterned to form a fourth conductive pad 980 and a ninth opening partially exposing upper surfaces of the active pattern 103, the isolation pattern 112 and the gate structure 170, and a fourth insulation pad 990 may be formed to fill the ninth opening. Alternatively, a fourth insulation pad layer may be formed on the substrate 100, the fourth insulation pad layer may be patterned to form the fourth insulation pad 990, and the fourth conductive pad 980 may be formed.

In example embodiments, the ninth opening may include a first portion extending in the first direction D1 and a second portion extending in the second direction D2, which may be connected with each other. Thus, the fourth insulation pad 990 that may be formed in the ninth opening may include a first extension portion extending in the first direction D1 and a second extension portion extending in the second direction D2, which may be connected with each other. A plurality of fourth conductive pads 980 may be spaced apart from each other in the first and second directions D1 and D2, and may be arranged in a lattice pattern in a plan view.

In example embodiments, the fourth conductive pad 980 may overlap in the vertical direction an end portion in the third direction D3 of each of the active patterns 103 and a portion of the isolation pattern 112 adjacent thereto in the first direction D1.

Referring to FIGS. 31 and 32, a fifth insulation pad layer 1000 may be formed on the fourth conductive pad 980 and the fourth insulation pad 990, the fifth insulation pad layer 1000 may be patterned, and processes substantially the same as those illustrated with reference to FIGS. 7 and 8 may be performed.

Particularly, the fourth conductive pad 980, the fourth insulation pad 990, the active pattern 103, the isolation pattern 112 and the gate mask 160 may be partially etched using the fifth insulation pad layer 1000 as an etching mask to form the second opening 805.

In example embodiments, the fifth insulation pad layer 1000 may have a shape of a circle or an ellipse in a plan view, and a plurality of fifth insulation pad layers 1000 may be spaced apart from each other in the first and second directions D1 and D2. Each of the fifth insulation pad layers 1000 may overlap in the vertical direction end portions of the active patterns 103 adjacent to each other in the first direction D1 and a portion of the isolation pattern 112 therebetween.

Referring to FIG. 33, processes substantially the same as those illustrated with reference to FIGS. 9 to 14 may be performed.

Thus, the third recess 105 may be formed at the upper portion of the active pattern 103 exposed by the second opening 805, the epitaxial layer 107 may be formed in the third recess 105, and the impurity region 109 may be formed in the portion of the active pattern 103 under the third recess 105.

Additionally, the filling structure including the conductive filling pattern 850, the lower spacer structure, the second capping pattern 860 and the insulating filling pattern 870 may be formed in the second opening 805.

The bit line structure 395 may be formed on the filling structure, and the fifth insulation pad layer 1000 may be patterned to form a fifth insulation pad 1005 between the portion of the bit line structure 395 at the outside of the second opening 805 and the fourth insulation pad 990.

Referring to FIG. 28 again, processes substantially the same as those illustrated with reference to FIGS. 14 to 22 and FIGS. 1 and 2 may be performed to complete the fabrication of the semiconductor device.

The lower contact plug 930 may be formed to contact the fourth conductive pad 980.

While example embodiments have been particularly shown and described, it will be understood by one of ordinary skill in the art that variations in form and detail may be made therein without departing from the spirit and scope of the claims.

What is claimed is:

1. A semiconductor device comprising:
an active pattern protruding from an upper surface of a substrate in a vertical direction perpendicular to the upper surface of the substrate;
an isolation pattern covering a sidewall of the active pattern;
an epitaxial layer on the active pattern, the epitaxial layer including single crystalline silicon doped with impurities;
an impurity region in a portion of the active pattern under the epitaxial layer, the impurity region including impurities;
a conductive filling pattern on the epitaxial layer;
a spacer structure directly contacting a sidewall of the conductive filling pattern; and
a bit line structure on the conductive filling pattern, wherein the isolation pattern directly contacts the upper surface of the substrate, a sidewall of the spacer structure, and a lower surface of the conductive filling pattern.

2. The semiconductor device according to claim 1,
wherein the substrate includes single crystalline silicon, and
wherein the single crystalline silicon included in the epitaxial layer has a crystal plane that is different from a crystal plane of the single crystalline silicon included in the substrate.

3. The semiconductor device according to claim 2, wherein the epitaxial layer has a stacking fault.

4. The semiconductor device according to claim 1, wherein the impurities included in the impurity region are the same as the impurities included in the epitaxial layer.

5. The semiconductor device according to claim 1, wherein a lower surface of the impurity region is lower than or substantially-coplanar with a lower surface of the active pattern.

6. The semiconductor device according to claim 1, wherein an interface between the impurity region and the epitaxial layer includes chlorine, bromine, or fluorine.

7. The semiconductor device according to claim 1,
wherein the epitaxial layer is disposed on a central portion of the active pattern, and
wherein an upper surface of the epitaxial layer is lower than an upper surface of each of opposite end portions of the active pattern.

8. The semiconductor device according to claim 7, further comprising:
a conductive pad structure on the active pattern and the isolation pattern, the conductive pad structure overlapping at least a portion of the conductive filling pattern in a horizontal direction that is parallel to the upper surface of the substrate.

9. The semiconductor device according to claim 8,
wherein the conductive pad structure contacts each of the opposite end portions of the active pattern, and
wherein the semiconductor device further comprises:
a contact plug structure on the conductive pad structure; and
a capacitor on the contact plug structure.

10. The semiconductor device according to claim 1, wherein the epitaxial layer includes a lower portion and an upper portion contacting each other, the lower portion having a width less than a width of the upper portion.

11. The semiconductor device according to claim 1,
wherein the conductive filling pattern includes a metal, and
wherein the semiconductor device further comprises a metal silicide pattern between the epitaxial layer and the conductive filling pattern.

12. The semiconductor device according to claim 1, wherein the conductive filling pattern includes a lower portion and an upper portion contacting each other, the lower portion having a width greater than a width of the upper portion.

13. A semiconductor device comprising:
an active pattern on a substrate;
an epitaxial layer on the active pattern, the epitaxial layer including single crystalline silicon doped with impurities;
an impurity region in a portion of the active pattern under the epitaxial layer, the impurity region including impurities; and a bit line structure electrically connected to the epitaxial layer, wherein an interface between the impurity region and the epitaxial layer includes chlorine, bromine, or fluorine, and wherein the active pattern includes at least one of silicon or germanium.

14. The semiconductor device according to claim 13, wherein the epitaxial layer has a stacking fault.

15. The semiconductor device according to claim 13, wherein the impurities included in the impurity region are substantially the same as the impurities included in the epitaxial layer.

16. The semiconductor device according to claim 13, wherein a lower surface of the impurity region is lower than or coplanar with a lower surface of the active pattern.

17. The semiconductor device according to claim 13, wherein the epitaxial layer is disposed on a central portion of the active pattern, and wherein an upper surface of the epitaxial layer is lower than an upper surface of each of opposite end portions of the active pattern.

18. A semiconductor device comprising:

an active pattern protruding from an upper surface of a substrate in a vertical direction perpendicular to the upper surface of the substrate;

an isolation pattern covering a sidewall of the active pattern;

an epitaxial layer on the active pattern, the epitaxial layer including single crystalline silicon doped with impurities;

an impurity region in a portion of the active pattern under the epitaxial layer, the impurity region including impurities;

a conductive filling pattern on the epitaxial layer;

a lower spacer structure on a sidewall of the conductive filling pattern;

a bit line structure on the conductive filling pattern;

a conductive pad structure on each of opposite end portions of the active pattern, the conductive pad structure overlapping at least a portion of the conductive filling pattern in a horizontal direction parallel to the upper surface of the substrate;

a contact plug structure on the conductive pad structure; and a capacitor on the contact plug structure, wherein the isolation pattern directly contacts the upper surface of the substrate, a sidewall of the lower spacer structure, and a lower surface of the conductive filling pattern.

19. The semiconductor device according to claim 18, wherein a lower surface of the impurity region is lower than or coplanar with a lower surface of the active pattern.

20. The semiconductor device according to claim 18, wherein an interface between the impurity region and the epitaxial layer includes chlorine, bromine, or fluorine.

* * * * *